(12) United States Patent  
Asahi et al.

(10) Patent No.: US 7,248,482 B2  
(45) Date of Patent: Jul. 24, 2007

(54) MODULE WITH BUILT-IN CIRCUIT COMPONENT AND METHOD FOR PRODUCING THE SAME

(75) Inventors: Toshiyuki Asahi, Osaka (JP); Yutaka Taguchi, Ibaraki (JP); Yasuhiro Sugaya, Toyonaka (JP); Seiichi Nakatani, Hirakata (JP); Toshio Fujii, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 547 days.

(21) Appl. No.: 10/844,823

(22) Filed: May 12, 2004

(65) Prior Publication Data

US 2004/0226744 A1  Nov. 18, 2004

(30) Foreign Application Priority Data

May 16, 2003  (JP) ............................. 2003-139345

(51) Int. Cl.
*H01R 12/16* (2006.01)
*H05K 1/14* (2006.01)

(52) U.S. Cl. ...................... 361/790; 361/784; 361/792; 361/803

(58) Field of Classification Search ................ 174/261, 174/262, 264; 361/795, 784, 792, 790, 803
See application file for complete search history.

(56) References Cited

U.S. PATENT DOCUMENTS

| 6,038,133 | A | 3/2000 | Nakatani et al. |
| 6,885,561 | B1 * | 4/2005 | Hashemi et al. ............ 361/760 |
| 2003/0090883 | A1 | 5/2003 | Asahi et al. |

FOREIGN PATENT DOCUMENTS

JP  11-220262  8/1999

* cited by examiner

*Primary Examiner*—Tuan T. Dinh
*Assistant Examiner*—Ivan Carpio
(74) *Attorney, Agent, or Firm*—Hamre, Schumann, Mueller & Larson, P.C.

(57) ABSTRACT

A module with a built-in circuit component of the present invention includes an electric insulating layer, a pair of wiring layers provided on both principal planes of the electric insulating layer, a plurality of via conductors electrically connecting the pair of wiring layers and passing through the electric insulating layer in a thickness direction thereof, and a circuit component buried in the electric insulating layer, wherein the plurality of via conductors are disposed in a circumferential portion of the electric insulating layer in accordance with a predetermined rule. The plurality of via conductors are placed at an interval, for example, so as to form at least one straight line, in a cut surface of the electric insulating layer in a direction parallel to a principal plane thereof.

6 Claims, 20 Drawing Sheets

MODULE WITH BUILT-IN CIRCUIT COMPONENT AND METHOD FOR PRODUCING THE SAME

BACKGROUND OF THE INVENTION

1. Field of the Invention

The present invention relates to a module with a built-in circuit component in which a circuit component is buried in an electric insulating layer, and a method for producing the same.

2. Description of the Related Art

Recently, along with a demand for an increase in performance and miniaturization of electronic equipment, there also is a demand for an increase in density and functionality, and miniaturization with respect to a module with a built-in circuit component in which a plurality of circuit components are mounted. As a method for increasing the density, the connection using inner vias is being developed. If inner vias are used, for example, wiring connecting an LSI to another circuit component can be minimized. A plurality of inner vias are placed at arbitrary positions in an electric insulating layer (layer with a built-in circuit component) (e.g., see JP11(1999)-220262A).

In the course of production, the module with a built-in circuit component is subjected to at least one inspection selected from a mounting inspection and a characteristic inspection with respect to a circuit component and the like, after the circuit component is connected to a wiring layer and before the circuit component is buried in an electric insulating layer. In these inspections, probes of an inspection tool are brought into contact with land portions (conductive portions for connection constituting a wiring layer) to be connected to inner vias. Then, a voltage is applied to an object to be inspected, whereby it is determined whether or not an electric connection satisfying predetermined conditions is obtained.

However, in the conventional module with a built-in circuit component, a plurality of inner vias and land portions connected thereto are placed at arbitrary positions. Therefore, in order to perform an inspection, a dedicated inspection tool including a plurality of probes arranged so as to correspond to the above-mentioned plurality of land portions is required. This inspection tool cannot be used for another module with a built-in circuit component.

SUMMARY OF THE INVENTION

A module with a built-in circuit component of the present invention includes an electric insulating layer, a pair of wiring layers provided on both principal planes of the electric insulating layer, a plurality of via conductors electrically connecting the pair of wiring layers and passing through the electric insulating layer in a thickness direction thereof, and a circuit component buried in the electric insulating layer. The plurality of via conductors are disposed at least on a part of a circumference of the electric insulating layer in accordance with a predetermined rule.

Another module with a built-in circuit component of the present invention includes an electric insulating layer, a pair of wiring layers provided on both principal planes of the electric insulating layer, a plurality of via conductors electrically connecting the pair of wiring layers and passing through the electric insulating layer in a thickness direction thereof, and a circuit component buried in the electric insulating layer. The electric insulating layer includes a first region in which the circuit component is disposed, and a second region in which the plurality of via conductors are disposed, in a cut surface of the electric insulating layer in a direction parallel to the principal plane thereof. The plurality of via conductors are disposed at an interval so as to substantially form a matrix in the second region.

A method for producing a module with a built-in circuit component of the present invention includes the processes of (a) preparing two first sheet-shaped materials in which a wiring layer including a plurality of land portions is formed on one principal plane of a peeling film or on one principal plane of an insulating substrate, and mounting a circuit component on at least one of the first sheet-shaped materials, (b) performing at least one inspection selected from a mounting inspection and a characteristic inspection, (c) forming an electric insulating material into a second sheet-shaped material in which a plurality of through holes are formed at predetermined positions, filling the through holes with a conductive material, and disposing the second sheet-shaped material filled with the conductive material between the first sheet-shaped materials so that surfaces of the first sheet-shaped materials with the circuit component mounted thereon face the second sheet-shaped material, and thereafter, heating them under pressure in a thickness direction, thereby burying the circuit component in the second sheet-shaped material. In the process (a), the plurality of land portions are disposed on a circumference of one principal plane of the peeling film or on one principal plane of the insulating substrate, in accordance with a predetermined rule. In the process (b), the inspection is performed using an inspection tool including a plurality of probes disposed corresponding to the plurality of land portions and a support for supporting the plurality of probes.

Another method for producing a module with a built-in circuit component of the present invention includes the processes of (a) preparing two first sheet-shaped materials in which a wiring layer including a plurality of land portions is formed on one principal plane of a peeling film or on one principal plane of an insulating substrate, and mounting a circuit component on at least one of the first sheet-shaped materials, (b) performing at least one inspection selected from a mounting inspection and a characteristic inspection, and (c) forming an electric insulating material into a second sheet-shaped material in which a plurality of through holes are formed at predetermined positions, filling the through holes with a conductive material, and disposing the second sheet-shaped material filled with the conductive material between the first sheet-shaped materials so that surfaces of the first sheet-shaped materials with the circuit component mounted thereon face the second sheet-shaped material, and thereafter, heating them under pressure in a thickness direction, thereby burying the circuit component in the second sheet-shaped material. In the process (a), the plurality of land portions are disposed at an interval so as to substantially form a matrix on one principal plane of the peeling film or on one principal plane of the insulating substrate. In the process (b), the inspection is performed using an inspection tool including a plurality of probes disposed corresponding to the plurality of land portions and a support for supporting the plurality of probes.

According to the present invention, an inspection tool used in at least one inspection selected from the group consisting of a mounting inspection and a characteristic inspection used in the course of production of a module with a built-in circuit component can be shared between the module with a built-in circuit component and other modules with a built-in circuit component. Thus, the reduction in cost and enhancement of productivity can be realized.

These and other advantages of the present invention will become apparent to those skilled in the art upon reading and understanding the following detailed description with reference to the accompanying figures.

DESCRIPTION OF THE PREFERRED EMBODIMENTS

Figure 1:
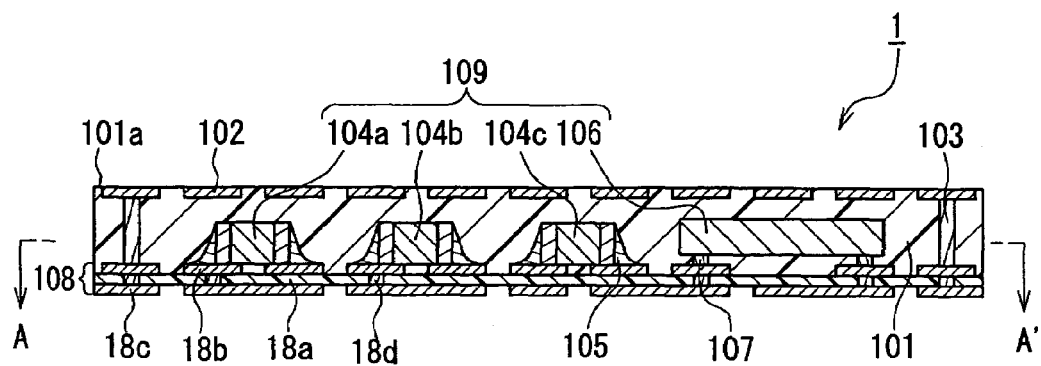
FIG. 1 is a cross-sectional view showing an exemplary module with a built-in circuit component of the present invention.

In the present invention, "disposed in accordance with a predetermined rule" refers to that a plurality of via conductors are arranged regularly (e.g., a plurality of via conductors are disposed at an interval so as to form at least one straight line, they are disposed so as to form three sides among four sides of a rectangle, they are disposed so as to form a rectangle, they are formed in a zigzag manner, they are disposed substantially at an equal interval, etc.).

In the present invention, a land portion refers to a conductive portion for connection to be connected to a via conductor. A wiring layer includes a plurality of above-mentioned land portions. The wiring layer further may include at least one of a conductive wire electrically connected to each land portion and the like, and a pad electrode connected to an electrode of a circuit component.

A mounting inspection refers to an inspection for confirming the conduction of a mounted circuit component with respect to a wiring layer. A characteristic inspection refers to an inspection for checking the electrical operation of a component of a module with a built-in circuit component and confirming the characteristics of the component, or an inspection for checking the electrical operation of a provisional module containing a component and confirming the characteristics of the component.

In the module with a built-in circuit component of the present invention, it is preferable that the plurality of via conductors are disposed at an interval so as to form at least one straight line, in a cut surface of the electric insulating layer cut in a direction parallel to the principal plane thereof.

In the module with a built-in circuit component of the present invention, it is preferable that a flat shape of the electric insulating layer is a rectangle, and the plurality of via conductors are disposed at an interval along three sides among four sides of the rectangle or disposed at an interval so as to form a rectangle along four sides of the rectangle, in a cut surface of the electric insulating layer cut in a direction parallel to the principal plane thereof.

In the module with a built-in circuit component of the present invention, it is preferable that the plurality of via conductors are arranged in a zigzag manner, in a cut surface of the electric insulating layer cut in a direction parallel to the principal plane thereof.

The module with a built-in circuit component of the present invention preferably includes a plurality of the circuit components, wherein the electric insulating layer includes a first region in which the plurality of circuit components are disposed, and a second region in which the plurality of via conductors are disposed, in a cut surface of the electric insulating layer in a direction parallel to the principal plane thereof.

The module with a built-in circuit component of the present invention may include at least one wiring board, wherein at least one of the pair of wiring layers provided on both principal planes of the electric insulating layer may function as a wiring layer for the wiring board. The wiring board may have a multi-layered wiring configuration in which at least one wiring layer is provided in an insulating substrate.

The module with a built-in circuit component of the present invention includes a pair of wiring boards disposed so as to sandwich the electric insulating layer, wherein a coefficient of linear thermal expansion of the wiring boards in a direction orthogonal to a thickness direction thereof is smaller than that of the electric insulating layer in a direction orthogonal to a thickness direction thereof. Furthermore, a Young's modulus of the wiring boards is larger than that of the electric insulating layer. In the module with a built-in circuit component, one of the pair of wiring layers provided on both principal planes of the electric insulating layer functions as a wiring layer for one wiring board, and the other of the pair of wiring layers functions as a wiring layer for the other wiring board. Assuming that a distance from a center on a surface of the electric insulating layer cut in a direction parallel to the principal plane thereof to an edge of the surface is L, it is preferable that the plurality of via conductors are disposed in a region at a distance exceeding 0.7 L from the center. In the present specification, the Young's modulus refers to the tensile modulus of elasticity in a direction orthogonal to a thickness direction.

Another module with a built-in circuit component of the present invention may include at least one wiring board, wherein at least one of the pair of wiring layers provided on both principal planes of the electric insulating layer may function as a wiring layer on one surface of the wiring board. The wiring board may have a multi-layered wiring configuration in which at least one wiring layer is provided in an insulating substrate.

According to a method for producing a module with a built-in circuit component of the present invention, in the process of preparing two first sheet-shaped materials in which a wiring layer including a plurality of land portions is formed on one principal plane of a peeling film or on one principal plane of an insulating substrate, and mounting circuit components on at least one of the first sheet-shaped materials, the plurality of land portions preferably are disposed at an interval so as to form at least one straight line.

Furthermore, in the above process, a flat shape of the peeling film or the insulating substrate is a rectangle, and the plurality of land portions preferably are disposed at an interval along three sides among four sides of the rectangle or disposed at an interval so as to form a rectangle along four sides of the rectangle. Furthermore, in the above process, the plurality of land portions preferably are disposed so as to form a zigzag pattern.

In the method for producing a module with a built-in circuit component of the present invention, it is preferable that an inspection tool used in the process of performing at least one inspection selected from a mounting inspection and a characteristic inspection includes a plurality of probes and a support for supporting the probes, and the plurality of probes are disposed substantially at an equal interval. The probes preferably have a needle shape. The probes preferably have elasticity. The support for supporting the probes preferably has elasticity.

According to the above-mentioned method for producing a module with a built-in circuit component of the present invention, in the process of preparing two first sheet-shaped materials in which a wiring layer including a plurality of land portions is formed on one principal plane of a peeling film or on one principal plane of an insulating substrate, and mounting circuit components on at least one of the first sheet-shaped materials, the first sheet-shaped material may be a wiring board. Alternatively, the first sheet-shaped material may be a multi-layered wiring substrate in which a wiring layer is provided in the insulating substrate.

According to another method for producing a module with a built-in circuit component of the present invention, in the process of preparing two first sheet-shaped materials in which a wiring layer including a plurality of land portions is formed on one principal plane of a peeling film or on one principal plane of an insulating substrate, and mounting circuit components on at least one of the first sheet-shaped materials, the first sheet-shaped material may be a wiring board. Alternatively, the first sheet-shaped material may be a multi-layered wiring substrate in which a wiring layer is provided in the insulating substrate.

Hereinafter, an exemplary module with a built-in circuit component of the present invention will be described with reference to the drawings.

Embodiment 1

Figure 2:
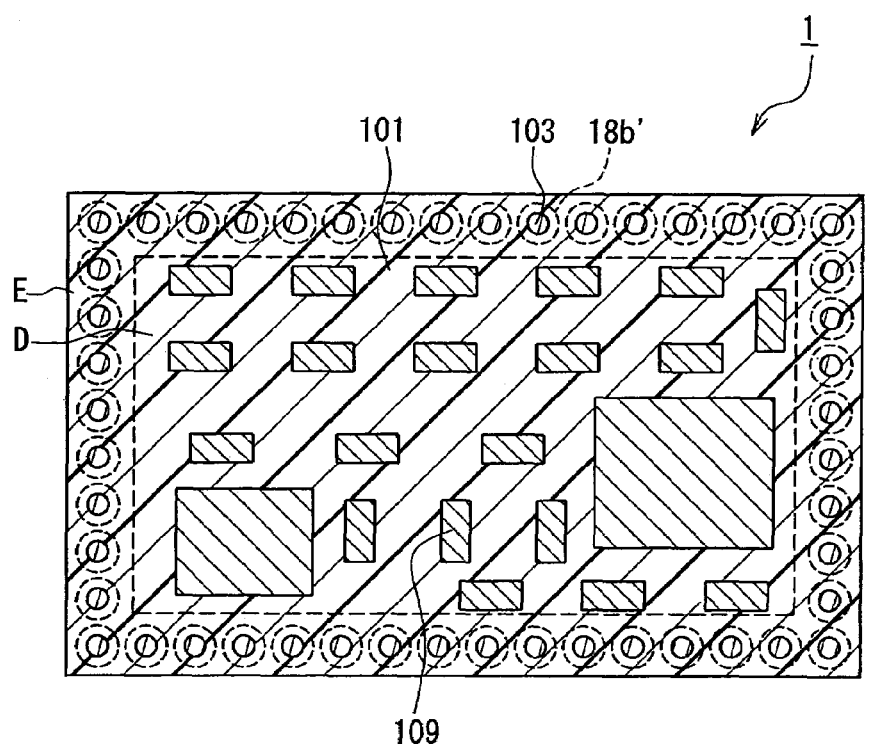
FIG. 2 is a cross-sectional view of the module with a built-in circuit component shown in FIG. 1 taken along a line A-A'.

FIG. 1 is a cross-sectional view of a module with a built-in circuit component of the present embodiment, and FIG. 2 is a cross-sectional view of the module with a built-in circuit component shown in FIG. 1 taken along a line A-A'.

As shown in FIGS. 1 and 2, a module with a built-in circuit component 1 of the present embodiment includes an electric insulating layer 101 in a rectangular shape in a plan view, a pair of wiring layers 18b, 102 provided on both principal planes of the electric insulating layer 101, a plurality of via conductors 103 electrically connecting the wiring layers 18b and 102, and a plurality of circuit components 109 buried in the electric insulating layer 101. Each via conductor 103 passes through the electric insulating layer 101 in a thickness direction thereof. In the module with a built-in circuit component 1, the pair of wiring layers 18b, 102 are embedded in the electric insulating layer 101.

As shown in FIG. 2, the plurality of via conductors 103 are placed along four sides of the electric insulating layer 101 on a circumference thereof, in a cut surface of the electric insulating layer 101 cut in a direction parallel to a principal plane 101a thereof (see FIG. 1). Furthermore, the plurality of via conductors 103 are arranged substantially at an equal interval. The wiring layer 18b shown in FIG. 1 has a plurality of land portions 18b' as shown in FIG. 2, which are connected to the via conductors 103. The wiring layer 102 (see FIG. 1) also has a plurality of land portions at positions corresponding to the above-mentioned plurality of land portions 18b'.

The module with a built-in circuit component 1 includes a wiring board 108 connected to one principal plane of the electric insulating layer 101. The wiring layer 18b buried in the electric insulating layer 101 functions as a wiring layer for the wiring board 108. The plurality of circuit components 109 are mounted on the wiring board 108 to be integrated therewith before being buried in the electric insulating layer 101.

In the course of production of the module with a built-in circuit component 1, after the circuit components 109 are mounted on the wiring board 108 and before they are buried in the electric insulating layer 101, at least one inspection selected from a mounting inspection and a characteristics inspection is performed.

Figure 3:
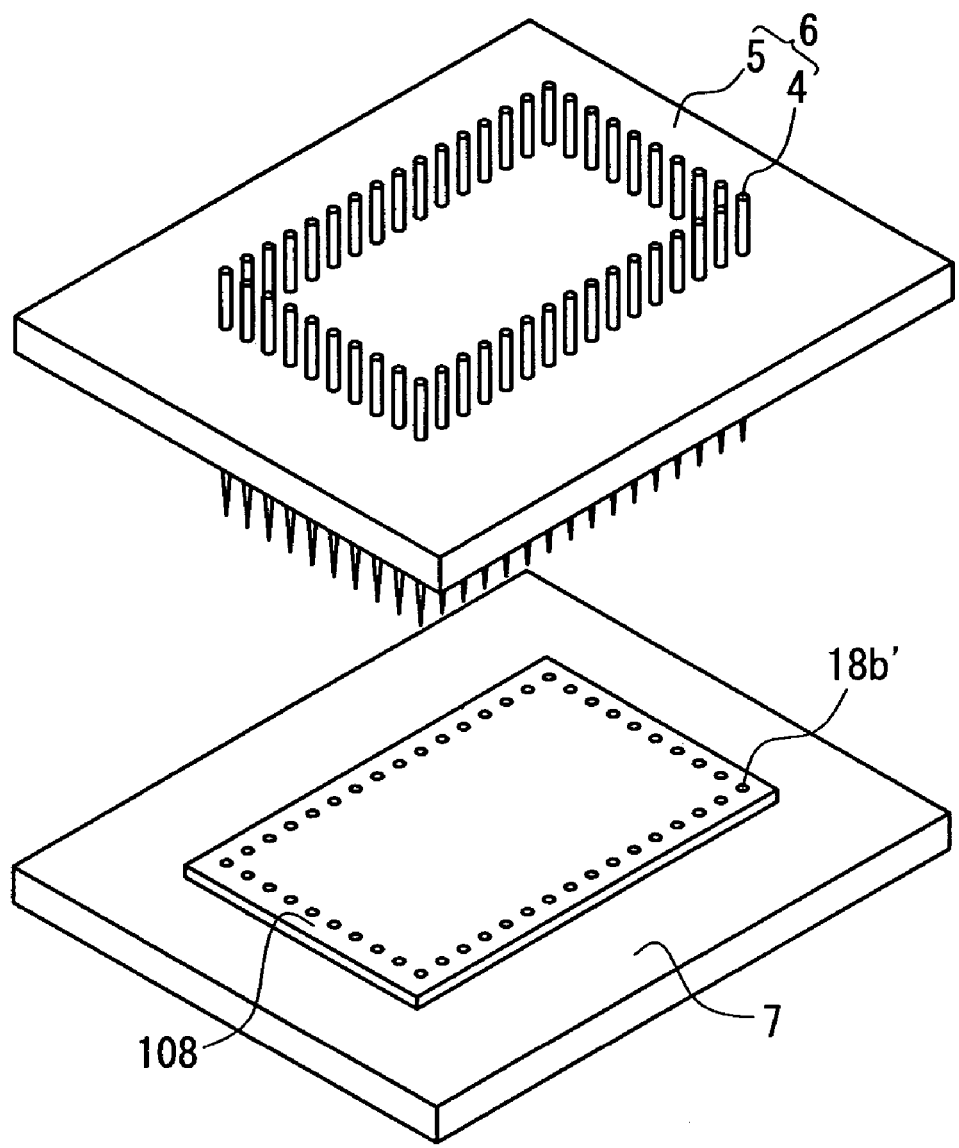
FIG. 3 is a perspective view illustrating the state of an inspection performed in the course of production of the module with a built-in circuit component shown in FIG. 1.

For example, in the mounting inspection, an inspection tool 6 as shown in FIG. 3 is used. As shown in FIG. 3, the inspection tool 6 includes a plurality of probes 4 made of a conductor, wiring (not shown) for connecting each probe 4 to a power source, and a plate-shaped support 5 for supporting the plurality of probes 4. The plurality of probes 4 are arranged substantially at an equal interval so as to form a rectangle (i.e., four straight lines) in a plan view. The probes 4 pass through the support 5, and ends thereof project from one surface of the support 5.

The inspection tool 6 shown in FIG. 3 also can be used, for example, in an inspection of another module with a built-in circuit component in which the plurality of via conductors 103 and the plurality of land portions 18b' (see FIG. 2) are provided along one side among four sides on a circumference of the electric insulating layer 101, still another module with a built-in circuit component in which the plurality of via conductors and the plurality of land portions are provided along two sides, and the like, in addition to the module with a built-in circuit component of the present embodiment. Furthermore, the inspection tool 6 also can be used in the above-mentioned inspection of various kinds of modules with a built-in circuit component provided with a plurality of via conductors (and the land portions) selected arbitrarily from a plurality of via conductors 103 (and the land portions 18b') shown in FIG. 2.

As described above, the inspection tool 6 including the probes 4 arranged periodically can be used in the above-mentioned inspection of various kinds of modules with a built-in circuit component. Thus, the module with a built-in circuit component 1 can share the inspection tool 6 with various kinds of modules with a built-in circuit component, realizing a reduction in cost and enhancement of productivity.

Generally, in a design rule of the module with a built-in circuit component, the distance between a circuit component and a via conductor is larger than that between circuit components. The distance between a circuit component and a via conductor is, for example, 500 μm, while the distance between circuit components is, for example, 150 μm. Thus, for example, when the via conductors 103 are placed between the circuit components 109, an increase in density is prevented, resulting in a complicated design.

As shown in FIG. 2, in the module with a built-in circuit component 1, the electric insulating layer 101 is divided into a first region D in which the plurality of circuit components 109 are placed and a second region E in which the plurality of via conductors 103 are placed, in a cut surface of the electric insulating layer 101 cut in a direction parallel to the principal plane thereof. This configuration can increase the density of the module, and reduce the difficulty in design for increasing the density. In the present embodiment, the via conductors 103 are not placed in the first region D, and the via conductors 103 are not placed between adjacent circuit components 109. In the second region E, the circuit components 109 are not placed. The first region D is placed at the center of the electric insulating layer 101, and the second region E is placed on the circumference of the electric insulating layer 101 so as to surround the first region D.

The electric insulating layer 101 is made of an insulating material (e.g., an insulating resin, a mixture containing a filler and an insulating resin, or the like). The electric insulating layer 101 further may contain a reinforcing material such as glass fabrics or the like. Examples of the insulating resin include a thermosetting resin, a thermoplastic resin, a light-curable resin, and the like. When epoxy resin, phenol resin, isocyanate resin, or the like is used, the heat resistance of the electric insulating layer 101 can be enhanced. When a material having a low dielectric loss tangent, such as fluoroplastic (e.g., polytetrafluoroethylene (PTFE)), polyphenyleneoxide (PPO), polyphenylene ether (PPE) or a liquid polymer, or a resin obtained by denaturing these resins is used, the high-frequency characteristics of the electric insulating layer 101 are enhanced.

In the case where the electric insulating layer 101 is formed of a mixture containing a filler and an insulating resin, if the kinds of the filler and the insulating resin are selected appropriately, the coefficient of linear thermal expansion, thermal conductivity, dielectric constant, and the like of the electric insulating layer 101 can be controlled easily. As the filler, for example, $Al_2O_3$, MgO, $SiO_2$, BN, AMN, $Si_3N_4$, "Teflon" (Trade Name), or the like can be used. In the case of using $Al_2O_3$, BN, and AlN, an electric insulating layer with high thermal conductivity can be produced, and the heat radiation of the electric insulating layer can be enhanced. $Al_2O_3$ also has the advantage of a low cost. In the case of using $SiO_2$, $Si_3N_4$, or "Teflon" (Trade Name), an electric insulating layer with a low dielectric constant can be produced. In particular, $SiO_2$ with a low specific gravity is suitable for use in a mobile telephone, or the like. When BN is used, the coefficient of linear thermal expansion of the electric insulating layer can be decreased.

A dispersant, a colorant, a coupling agent, a release agent, or the like may be added to a mixture containing a filler and an insulating resin. When a dispersant is added, the dispersibility of the filler in the insulating resin can be enhanced. If the electric insulating layer is colored with a colorant, it becomes easy to use an automatic recognition apparatus. When a coupling agent is added, the adhesion strength between the insulating resin and the filler is enhanced, and the insulation of the electric insulating layer 101 can be enhanced. When the release agent is added, the release property with respect to a mold can be enhanced, resulting in enhanced productivity.

The wiring layer 102 is formed of a material having electric conductivity, such as a metal foil or a conductive resin composition. As the metal foil, for example, a copper foil having a thickness of about 3 μm to 35 μm produced by electroplating can be used. It is desirable that the surface of the copper foil to be brought into contact with the electric insulating layer 101 is roughened so as to enhance the adhesion with respect thereto. Furthermore, in order to enhance adhesion and oxidation resistance, a copper foil whose surface is subjected to coupling, or a copper foil plated with tin, zinc, or nickel may be used. Furthermore, as the wiring layer 102, a lead frame of a metal plate formed by etching or punching may be used. The wiring layer 102 formed on a peeling film may be transferred to be formed on the electric insulating layer 101. A coupler, a filter, and the like may be obtained by forming the wiring layer 102 into a predetermined wiring pattern.

The via conductor 103 is made of a conductive material, for example, a conductive resin composition in which metal particles and a thermosetting resin are mixed, or the like. As the metal particles, for example, gold, silver, copper, palladium, nickel, or the like can be used. Gold, silver, copper, nickel, or the like is preferable due to their high conductivity. Copper is particularly preferable due to its high conductivity and lower migration. When metal particles in which copper is covered with silver are used, both the characteristics: lower migration and high conductivity can be satisfied. As the thermosetting resin, for example, epoxy resin, phenol resin, or isocyanate resin can be used. The epoxy resin is particularly preferable due to its high heat resistance. Furthermore, the via conductor 103 also can be formed by forming a via hole in the electric insulating layer 101, followed by plating.

There is no particular limit to the number of the via conductors 103. The number of the via conductors is determined appropriately depending upon components to be mounted on the wiring layer 102, a circuit configuration, and the like. For example, in the case where a memory is mounted on the wiring layer 102, the number of the via conductors 103 is required to be, for example, about 8 to 1024, corresponding to the pin number of the memory.

The material and method for forming the wiring layers 18b, 18c constituting the wiring board 108 are the same as those of the wiring 102, and the material and method for forming via conductors 18d constituting the wiring board 108 are the same as those of the via conductors 103.

An insulating substrate 18a constituting the wiring board 108 is formed of, for example, an insulating resin, a mixture of a filler and an insulating resin, a ceramic, or the like. The insulating substrate 18a further may contain a reinforcing material such as glass fabrics or the like. Furthermore, the insulating substrate 18a may be made of the same material as that for the electric insulating layer 101. When the same material as that for the electric insulating layer 101 is used for the insulating substrate 18a, the characteristics of the insulating substrate 18a such as the coefficient of linear thermal expansion and the like become similar to those of the electric insulating layer 101, so that the reliability of electric connection is enhanced.

Examples of the circuit components 109 include passive components 104a to 104c, or an active component 106. Examples of the passive components 104a to 104c include a chip-shaped capacitor, a chip-shaped inductor, a chip-shaped resistor, a diode, a thermistor, a switch, and the like. Examples of the active component 106 include semiconductor elements such as a transistor, an IC, an LSI, and the like.

The passive components 104a to 104c are connected to the wiring layer 18b, for example, with a conductive material 105, as shown in FIG. 1. As the conductive material 105, metal such as gold, copper, a solder or the like, a conductive adhesive, etc. can be used. As the conductive adhesive, for example, gold, silver, copper, a silver-palladium alloy, or the like, which is kneaded with a thermosetting resin, can be used. If a high-temperature solder is used as the conductive material 105, remelting of a solder can be prevented during reflowing. Furthermore, if a lead-free solder or the above-mentioned conductive adhesive is used, the load on the environment can be alleviated.

The active component 106 may be, for example, a package such as a chip scale package (CSP) or a bare chip. The active component 106 is connected to the wiring layer 18b, for example, via a bump 107, as shown in FIG. 1. After the active component 106 is mounted, a sealing resin may be injected between the active component 106 and the wiring layer 18b. The injection of the sealing resin can suppress a gap from being formed between the active component 106 buried in the electric insulating layer 101 and the wiring board 108. As the sealing resin, an underfill resin or the like generally used for flip-chip bonding can be used. Examples of the underfill resin include an anisotropic conductive film (ACF), a non-conductive film (NCF), and the like.

In the example shown in FIGS. 1 and 2, the plurality of via conductors 103 (or the second region E) are present on a circumference of four sides of the electric insulating layer 101. However, the present invention is not limited thereto. The plurality of via conductors 103 (or the second region E) may be present at least on a part of the circumference of the electric insulating layer 101 (e.g., on a circumference of one side of the electric insulating layer 101).

Figure 4:
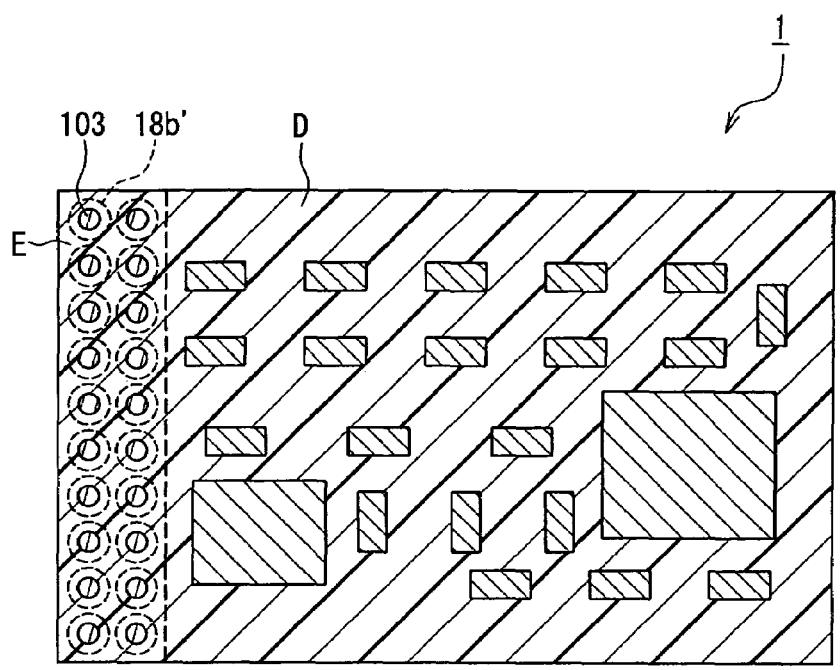
FIG. 4 is a cross-sectional view showing another exemplary module with a built-in circuit component of the present invention.
Figure 5:
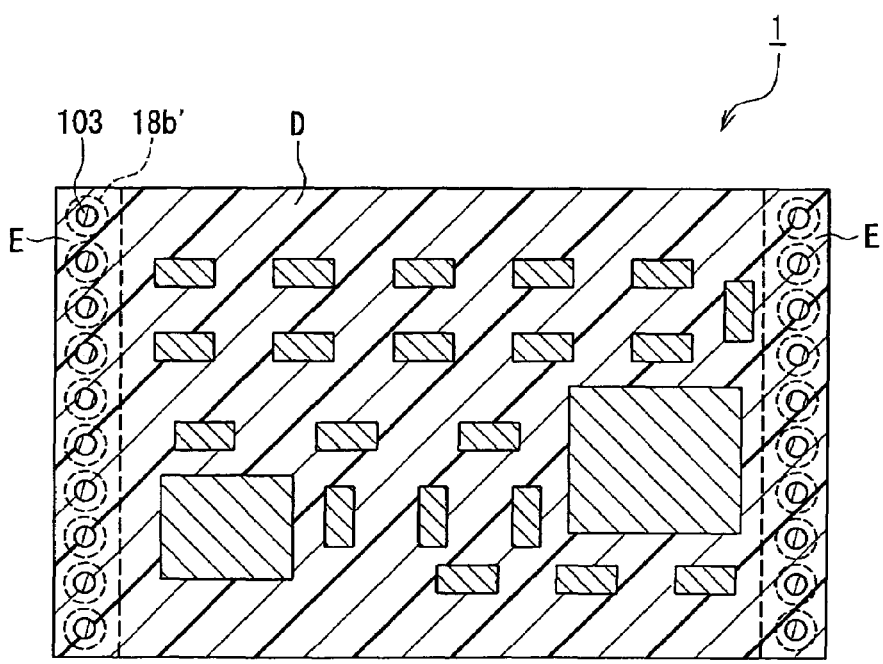
FIG. 5 is a cross-sectional view showing still another exemplary module with a built-in circuit component of the present invention.
Figure 6:
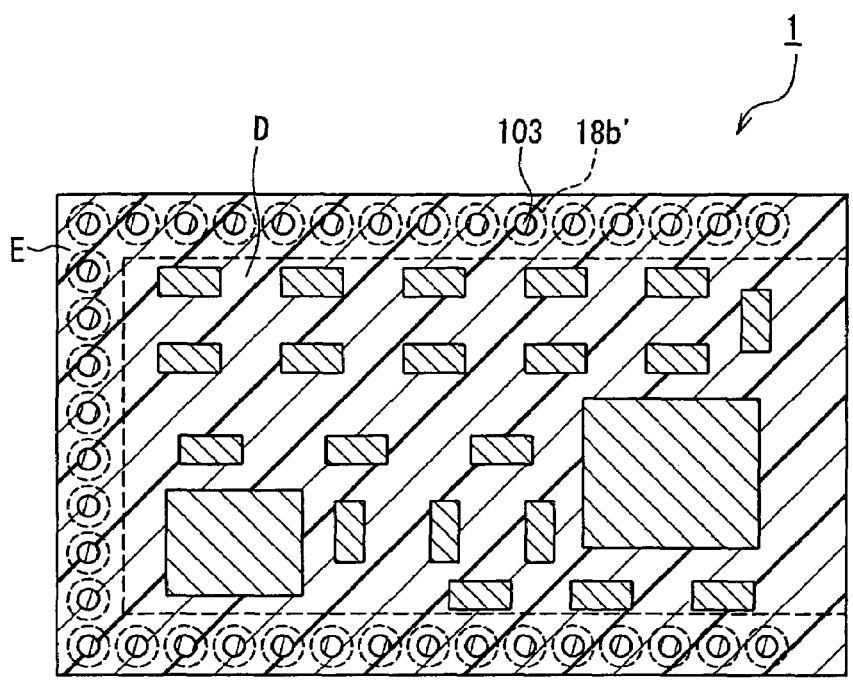
FIG. 6 is a cross-sectional view showing still another exemplary module with a built-in circuit component of the present invention.
Figure 7:
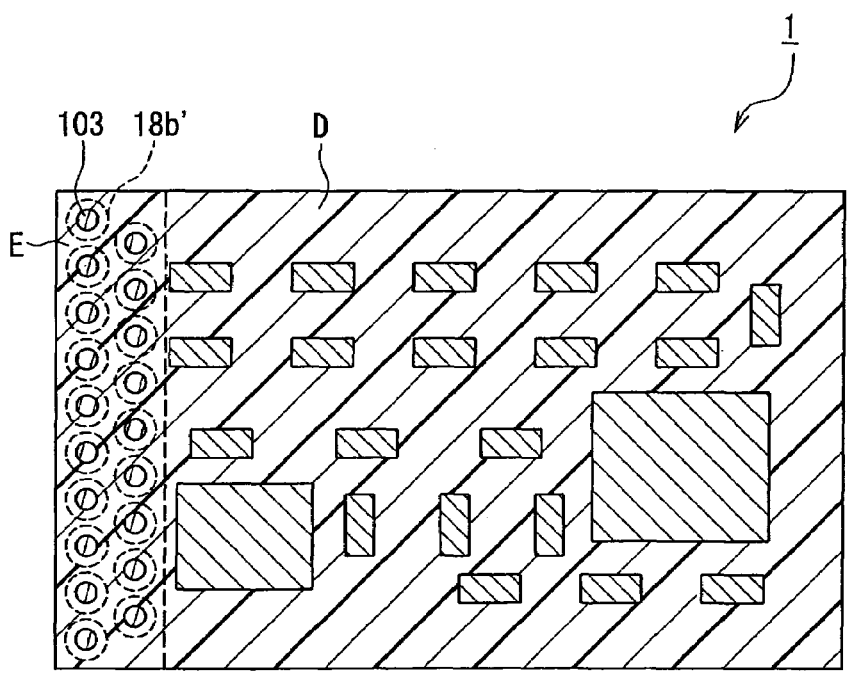
FIG. 7 is a cross-sectional view showing still another exemplary module with a built-in circuit component of the present invention.

Furthermore, in the example shown in FIGS. 1 and 2, the plurality of via conductors 103 are arranged substantially at an equal interval in four straight lines to define a rectangle, in a cut surface of the electric insulating layer 101 cut in a direction parallel to the principal plane thereof. However, the present invention is not limited thereto. For example, as shown in FIGS. 4 and 5, the plurality of via conductors 103 (and the land portions 18b') may be arranged at an interval so as to form at least two parallel lines. Furthermore, for example, as shown in FIG. 6, the plurality of via conductors 103 (and the land portions 18b') may be arranged at an interval along three sides among four sides of a rectangle, or arranged in a zigzag manner as shown in FIG. 7. When the land portions 18b' are arranged in a zigzag manner, it becomes easy to provide conductive wires directly electrically connected to the land portions 18b' on the surface of the insulating substrate 18a on which the wiring layer 18b (see FIG. 1) is provided. Furthermore, the plurality of via conductors 103 need not be arranged at an equal interval.

Furthermore, a plurality of probes of the inspection tool may be arranged at an interval so as to form at least two parallel lines, corresponding to the plurality of land portions 18b' shown in FIGS. 4 and 5, in a plan view of the inspection tool used in the course of production of the module with a built-in circuit component of the present embodiment. Furthermore, for example, a plurality of probes may be arranged at an interval so as to form three sides among four sides of a rectangle, corresponding to the plurality of land portions 18b' shown in FIG. 6. Furthermore, a plurality of probes may be arranged in a zigzag manner so as to correspond to the plurality of land portions 18b shown in FIG. 7.

In the examples shown in FIGS. 4 and 7, the second region E is present along one side of an electric insulating layer in a rectangular shape in a plan view. In the example shown in FIG. 5, the second region E is present along two opposed sides among four sides of a rectangle. In the example shown in FIG. 6, the second region E is present along three sides among four sides of a rectangle. In the examples shown in FIGS. 4 to 7, the via conductors 103 are not placed in the first region D, and the via conductors 103 are not placed between adjacent circuit components 109. In the second region E, the circuit components 109 are not placed.

Figure 8:
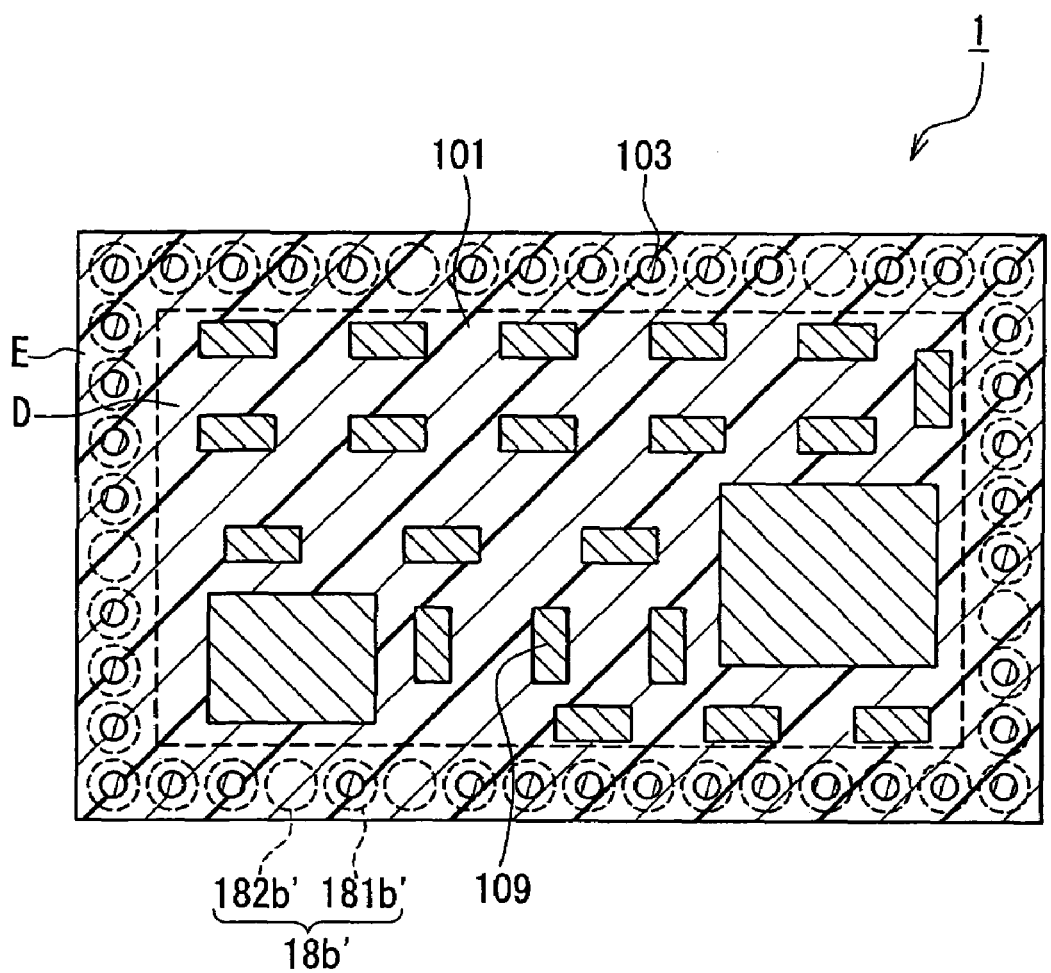
FIG. 8 is a cross-sectional view showing still another exemplary module with a built-in circuit component of the present invention.

In the examples shown in FIG. 2 and FIGS. 4 to 7, any of the plurality of land portions 18b' arranged on a circumference of the electric insulating layer 101 are connected to the via conductors 103. However, the present invention is not limited thereto. As shown in FIG. 8, the plurality of land portions 18b' may include at least one non-connection land portion 182b' that is not connected to any of the plurality of via conductors 103 but is used for an inspection. The plurality of land portions 18b' including connection land portions 181b' connected to the respective via conductors 103 and the non-connection land portions 182b' may be arranged at an equal interval so as to form at least one straight line.

In FIG. 2 and FIGS. 4 to 8, regarding the wiring layer 18b (see FIG. 1), only the plurality of land portions 18b' arranged on a circumference of the electric insulating layer 101 are shown, and conductive wires, pad electrodes to be connected to electrodes of circuit components, other land portions, and the like constituting the wiring layer 18b are omitted. Other land portions refer to those which are connected to the via conductors 18d (see FIG. 1).

Furthermore, the number of circuit components buried in the electric insulating layer is not particularly limited, and may be one or more.

Embodiment 2

In Embodiment 2, an exemplary method for producing the module with a built-in circuit component of Embodiment 1 will be described. The materials used in Embodiment 2 are the same as those described in Embodiment 1. The same members as those in Embodiment 1 are denoted with the same reference numeral as those therein, and the description thereof will be omitted here.

Figure 9A:
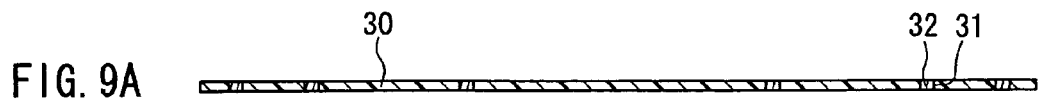
FIGS. 9A to 9E are cross-sectional views based on processes of an exemplary method for producing the module with a built-in circuit component shown in FIG. 1.

First, as shown in FIG. 9A, a sheet-shaped material 30 is molded from a mixture containing a thermosetting resin and an inorganic filler, by the following method.

A mixed slurry containing an inorganic filler, a thermosetting resin, and a solvent for decreasing a density is prepared. The mixed slurry is used to form a film on a peeling film. Although there is no particular limit to a film formation method, a doctor blade method, a coater method, an extrusion molding method, or the like can be used. Then, a part of the solvent is removed from the mixed slurry formed into a film.

Then, a plurality of through holes 31 are formed at predetermined positions of the sheet-shaped material 30. The through holes 31 can be formed, for example, by laser processing using a carbon dioxide gas laser, an excimer laser, etc., drilling, punching, or the like. In particular, laser processing is preferable due to its convenience and high precision. As a laser, a carbon dioxide gas laser, a YAG laser, an exciner laser, or the like can be used. Then, the through holes 31 are filled with a conductive resin composition 32.

Figure 9B:
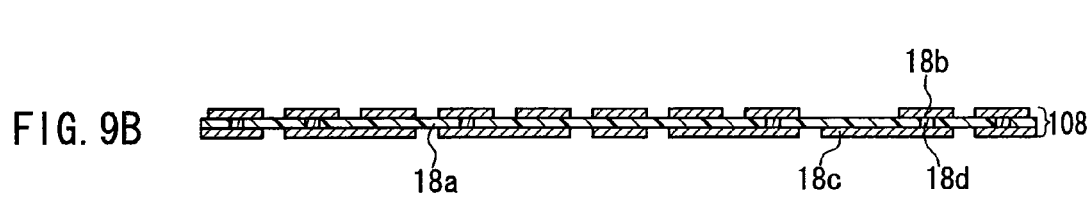

Then, both surfaces of the sheet-shaped material 30 are laminated with, for example, a copper foil (thickness: 9 μm) at 100° C. Then, the resultant layered structure is heated under pressure by hot pressing or the like, whereby the sheet-shaped material 30 and a thermosetting resin contained in the conductive resin composition 32 are cured. The cured sheet-shaped material 30 functions as an insulating substrate 18a, and the cured conductive resin composition 32 functions as via conductors 18d. Thereafter, an unnecessary portion is removed from the copper foil to form wiring layers 18b and 18c. Thus, a first sheet-shaped material (wiring board 108) is formed, in which the wiring layer 18b is formed on the insulating substrate 18a (see FIG. 9B).

Figure 10:
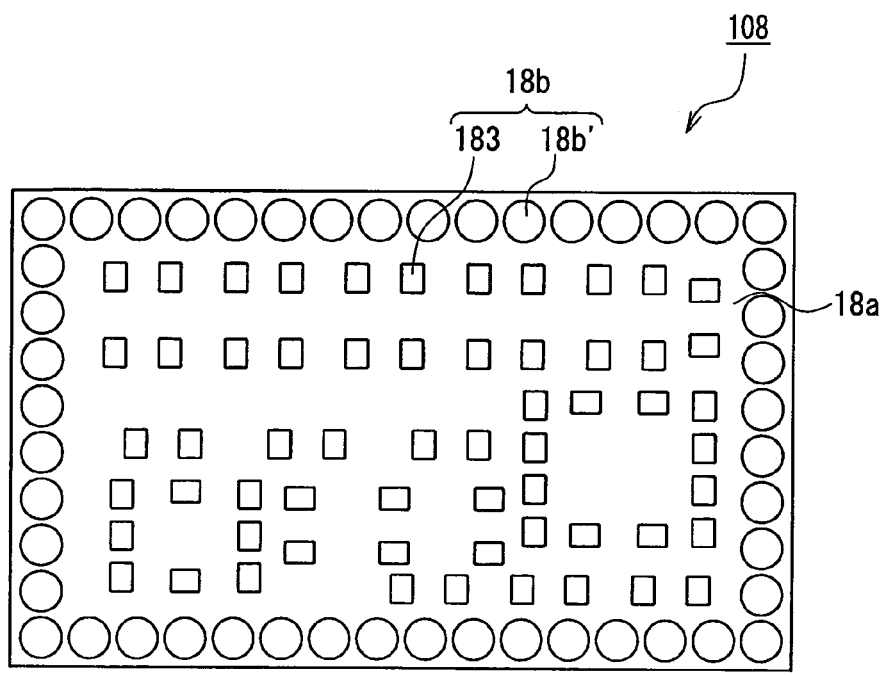
FIG. 10 is a schematic view of a first sheet-shaped material shown in FIG. 9B.

FIG. 10 is a schematic view of the first sheet-shaped material (wiring board 108) seen from the side of the wiring layer 18b. The wiring layer 18b is composed of a plurality of land portions 18b', a plurality of pad electrodes 183 connected to electrodes of circuit components, conductive wires (not shown), other land portions (not shown), and the like. The plurality of land portions 18b' are formed at an interval so as to form a rectangle on a circumference of one principal plane of the insulating substrate 18a. For ease of understanding, conductive wires, other land portions, and the like are omitted in FIG. 10.

Figure 9C:
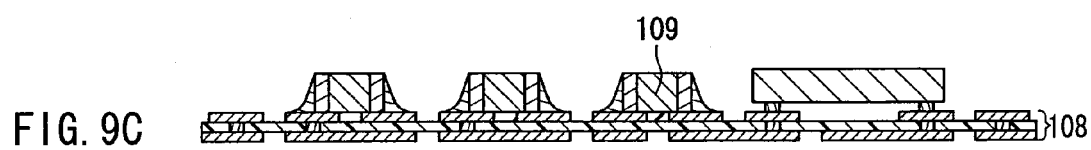

Next, as shown in FIG. 9C, a plurality of circuit components 109 are mounted on the first sheet-shaped material (wiring board 108). Then, the mounted plurality of circuit components 109 are subjected to a mounting inspection.

FIG. 3 shows the state where the mounting inspection is being performed. The wiring board 108 with a plurality of circuit components (not shown) mounted thereon is placed on a supporting plate 7. Then, the supporting plate 7 is aligned with a support 5 of an inspection tool 6 so that tips of probes 4 of the inspection tool 6 come into contact with the land portions 18b'. By bringing the inspection tool 6 close to the supporting plate 7 under the condition that an end face of the support 5 of the inspection tool 6 is aligned with an end face of the supporting plate 7, the ends of the probes 4 can be aligned easily with the land portions 18b'. Then, by applying a voltage to the wiring board 108 with a plurality of circuit components mounted thereon, it is determined whether or not an electric connection satisfying predetermined conditions is established. In FIG. 3, the circuit components 109 (see FIG. 9C) mounted on the wiring board 108 are omitted. Furthermore, in FIG. 3, regarding the wiring layer 18b (see FIG. 9B), only the land portions 18b' to be connected to the via conductors in the electric insulating layer are shown.

Figures 11A, 11B:
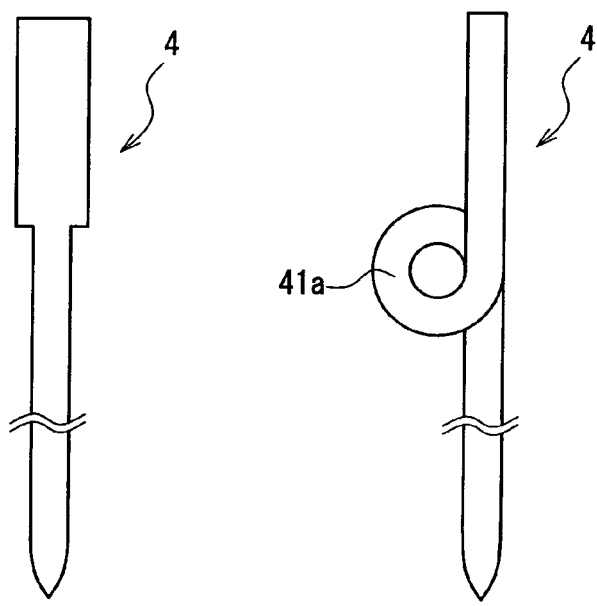
FIG. 11A is a front view showing an example of a probe.
FIG. 11B is a front view showing another example of a probe.

Although there is no particular limit to the shape of the probes 4, for example, they preferably have a needle shape as shown in FIG. 11A. When the probes 4 have a needle shape, they can be aligned easily with the land portions. Furthermore, as shown in FIG. 1B, the probe 4 may include a coil-shaped portion 41a so as to have spring-like elasticity. Furthermore, the support 5 shown in FIG. 3 may be formed of a material having rubber elasticity. If at least one selected from the probe 4 and the support 5 has elasticity in this manner, it is easy to adjust the inspection tool in the height direction during an inspection, which can enhance the productivity.

If the lengths of the ends of the probes 4 projecting from the supporter 5 are set to be larger than the heights of the circuit components 109 (see FIG. 9C) mounted on the wiring board 108, an inspection can be performed without damaging the circuit components 109.

Figure 9D:
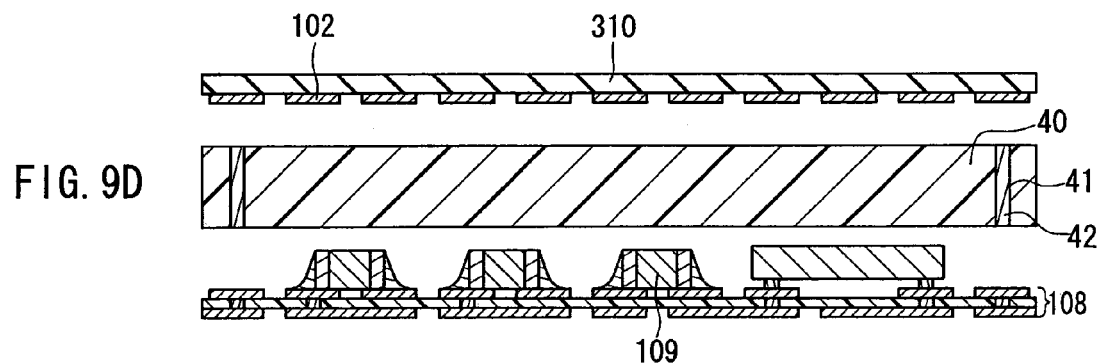

Next, as shown in FIG. 9D, a second sheet-shaped material 40 having a plurality of through holes 41 at predetermined positions is formed. The through holes 41 are provided at positions corresponding to the land portions 18b' (see FIG. 10). Then, the through holes 41 are filled with a conductive resin composition 42. The second sheet-shaped material 40 can be formed, for example, by the same material and method for the sheet-shaped material 30 (see FIG. 9A). The second sheet-shaped material 40 also can be produced by a method different from that for forming the sheet-shaped material 30 (see FIG. 9A). For example, the second sheet-shaped material 40 can be formed even by a method for forming an insulating material into a pellet shape, followed by melting, and injecting the melted material into a mold in a predetermined shape, a method for filling a mold with an insulating material, followed by melting, and molding the melted material, or the like. As a mold, a transfer mold or an injection mold can be used. For filling of the conductive resin composition 42, printing or injection may be adopted.

Figure 9E:
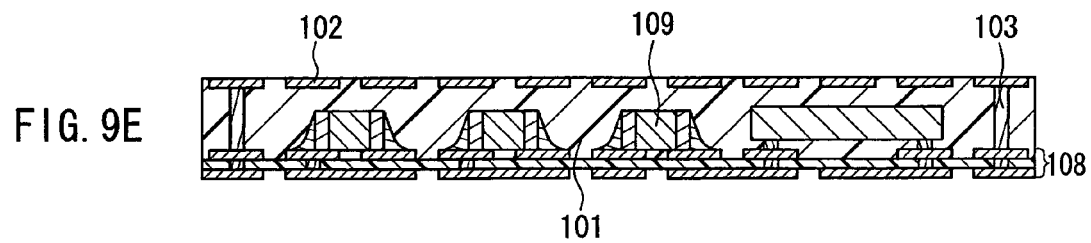

On the other hand, as shown in FIG. 9D, another first sheet-shaped material in which a wiring layer 102 is provided on a peeling film 310 is formed. Land portions to be connected to via conductors 103 (see FIG. 9E) constituting the wiring layer 102 are formed at positions corresponding to the land portions 18b' of the wiring layer 18b. The wiring layer 102 can be formed by laminating one surface of the peeling film 310 with a copper foil, and etching an unnecessary portion from the copper foil. The wiring layer 102 may be formed by printing or the like. In particular, when the wiring layer 102 is formed by etching, a minute wiring pattern can be formed. A peeling layer for facilitating peeling of the wiring layer 102 from the peeling film 310 may be positioned between the wiring layer 102 and the peeling film 310. As the peeling film 310, a resin film (made of polyethylene terephthalate (PET), polyphenylene sulfide (PPS), etc.), a metal foil (e.g., a copper foil, an aluminum foil, etc.), or the like can be used.

Next, as shown in FIG. 9D, the second sheet-shaped material 40 filled with the conductive resin composition 42 is placed between the wiring board 108 (first sheet-shaped material) with the circuit components 109 mounted thereon and the peeling film 310 (another first sheet-shaped material) with the wiring layer 102 formed thereon. Then, these are heated under pressure in a thickness direction, whereby the circuit components 109 are buried in the second sheet-shaped material 40.

Heating is conducted in an atmosphere at a temperature equal to or higher than a temperature at which the second sheet-shaped material 40 and the thermosetting resin contained in the conductive resin composition 42 are cured completely. Furthermore, pressing may be performed in a range of 50 g/mm² to 2 kg/mm² (0.5 MPa to 20 MPa). If pressing is performed under a pressure in the above range, the second sheet-shaped material 40, the circuit components 109, and the wiring board 108 can be allowed to adhere to each other strongly, whereby the mechanical strength of the module with a built-in circuit component can be enhanced.

Next, the peeling film 310 is peeled off from the wiring layer 102. The cured second sheet-shaped material 40 functions as an electric insulating layer 101, and the conductive resin composition 42 functions as via conductors 103 (see FIG. 9E).

Embodiment 3

Figure 12:
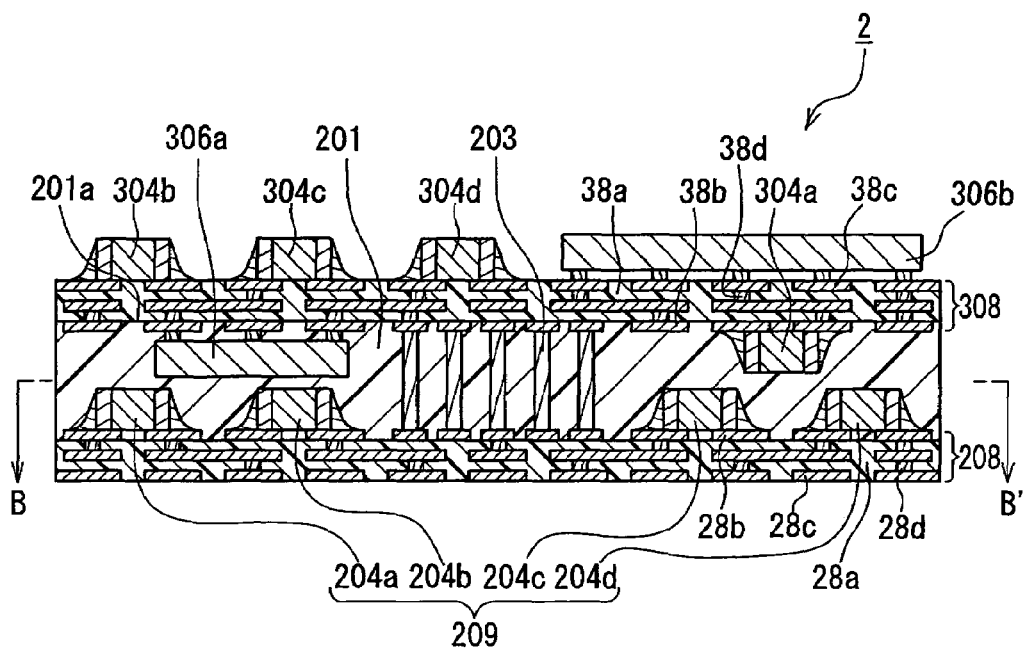
FIG. 12 is a cross-sectional view showing still another exemplary module with a built-in circuit component of the present invention.
Figure 13:
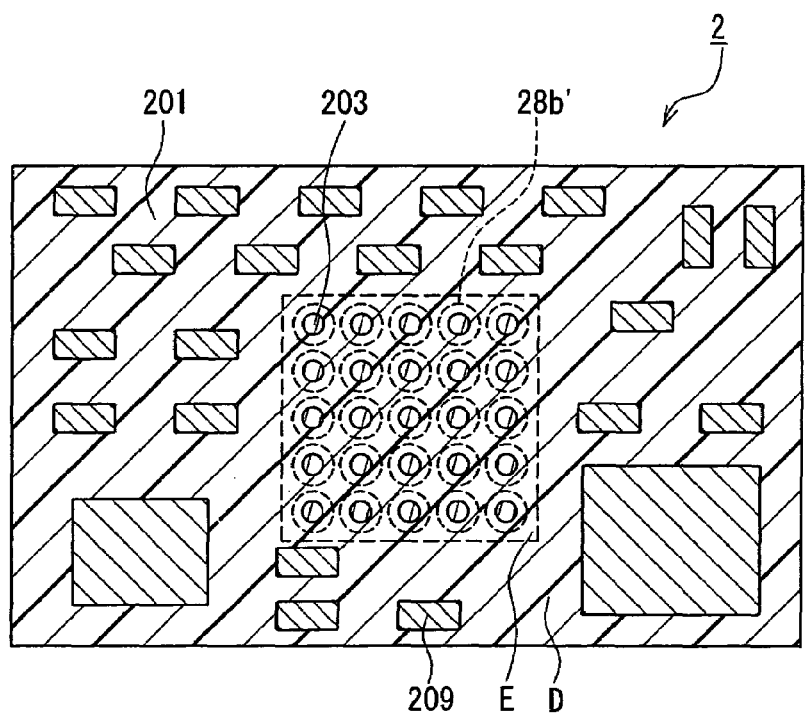
FIG. 13 is a cross-sectional view of the module with a built-in circuit component shown in FIG. 12 taken along a line B-B'.

FIG. 12 is a cross-sectional view of a module with a built-in circuit component of the present embodiment. FIG. 13 is a cross-sectional view of the module with a built-in circuit component shown in FIG. 12 taken along a line B-B'.

As shown in FIGS. 12 and 13, a module with a built-in circuit component 2 of the present embodiment includes an electric insulating layer 201 in a rectangular shape in a plan view, a pair of wiring layers 28b, 38b provided on both principal planes of the electric insulating layer 201, a plurality of via conductors 203 electrically connecting the wiring layers 28b, 38b, and a plurality of circuit components 209 (204a to 204d), 306a, and 304a buried in the electric insulating layer 201. The via conductors 203 pass through the electric insulating layer 201 in a thickness direction thereof. In the module with a built-in circuit component 2, the pair of wiring layers 28b, 38b are buried in the electric insulating layer 201.

As shown in FIG. 13, in the module with a circuit component 2 of the present embodiment, in the same way as in Embodiment 1, the electric insulating layer 201 is divided into a first region D in which the plurality of circuit components 209 are placed, and a second region E in which the plurality of via conductors 203 are placed, in a cut surface of the electric insulating layer 201 cut in a direction parallel to the principal plane thereof. The second region E is placed at the center of the electric insulating layer 201, and the first region D is placed on the circumference of the electric insulating layer 101 so as to surround the second region E. The plurality of via conductors 203 passing through the electric insulating layer 201 are placed at an interval so as to substantially form a matrix in the second region E. The circuit components 209 are not placed between adjacent via conductors 203.

The wiring layer 28b shown in FIG. 12 includes a plurality of land portions 28b' as shown in FIG. 13. Any of the land portions 28b' are connected to the via conductors 203.

In FIG. 13, regarding the wiring layer 28b (see FIG. 12), only the plurality of land portions 28b' placed in a center portion of the electric insulating layer 201 are shown, and conductive wires, pad electrodes to be connected to electrodes of the circuit components, other land portions, and the like constituting the wiring layer 28b are omitted. The other land portions refer to those which are connected to via conductors 28d (see FIG. 12).

As shown in FIG. 12, the module with a built-in circuit component 2 includes wiring boards 208, 308 connected to the electric insulating layer 201. The wiring layers 28b, 38b buried in the electric insulating layer 201 function as wiring layers for the wiring boards 208, 308. The circuit components 209, 306a, and 304a are mounted on the wiring boards 208, 308 to be integrated therewith before being buried in the electric insulating layer 201. In the module with a built-in circuit component 2, circuit components 304b to 304d, and 306b also are mounted on the surface of the wiring board 308 opposite to the side of the electric insulating layer 201. In FIG. 12, reference numerals 28a, 38a denote insulating substrates; 28d, 38d denote via conductors; and 28c, 38c denote wiring layers. These constitute the wiring boards 208, 308, respectively.

In the course of production of the module with a built-in circuit component 2, after the circuit components 209, 306a, and 304a are mounted on the wiring boards 208, 308, respectively, and before they are buried in the electric insulating layer 201, at least one inspection selected from a mounting inspection and a characteristics inspection is performed.

Figure 14:
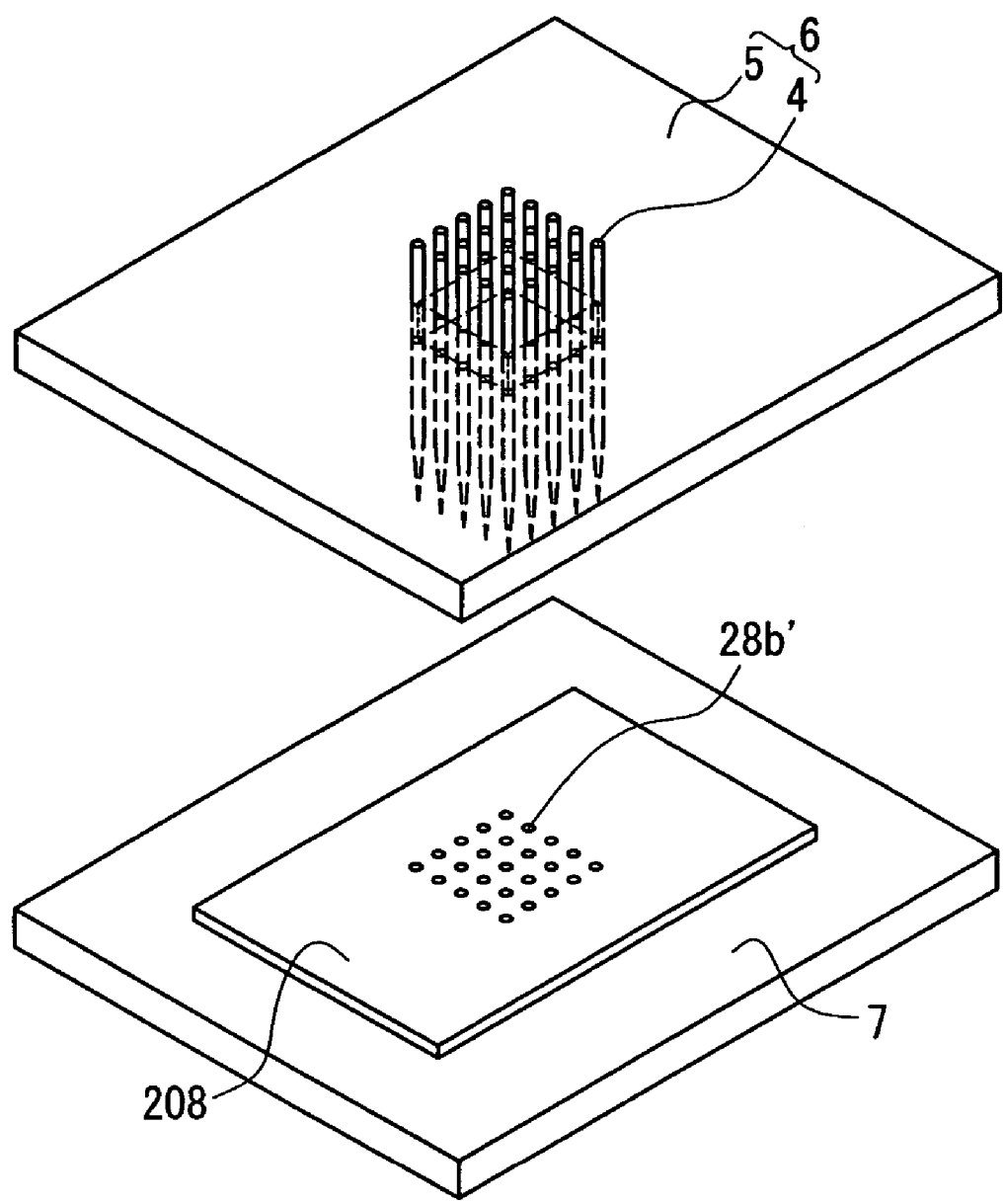
FIG. 14 is a perspective view illustrating the state of an inspection performed in the course of production of the module with a built-in circuit component shown in FIG. 12.

In the mounting inspection performed with respect to the circuit component 209 mounted on the wiring board 208 and the circuit components 306a, 304a mounted on the wiring board 308, for example, an inspection tool 6 as shown in FIG. 14 is used. The inspection tool 6 includes a plurality of probes 4 and a plate-shaped support 5 for supporting the plurality of probes 4. Each probe 4 passes through the support 5, and its end projects from one surface of the support 5. The plurality of probes 4 are arranged substantially at an equal interval so as to substantially form a matrix in a plan view of the inspection tool 6.

The inspection tool 6 shown in FIG. 14 also can be used, for example, in an inspection of another module with a built-in circuit component including only two columns among the plurality of via conductors 203 (and the land portions 28b' (see FIG. 13)) arranged in 5 rows and 5 columns, in addition to the module with a built-in circuit component 2 of the present embodiment. Furthermore, the inspection tool 6 also can be used in an inspection of various kinds of modules with a built-in circuit component provided with a plurality of via conductors (and the land portions) arbitrarily selected from a plurality of via conductors 203 (and the land portions 28b') shown in FIG. 13.

As described above, the inspection tool 6 including the probes 4 arranged periodically can be used in the above-mentioned inspection of various kinds of modules with a built-in circuit component. Thus, the module with a built-in circuit component 2 of the present embodiment can share the inspection tool 6 with various kinds of modules with a built-in circuit component, realizing the reduction in cost and enhancement of productivity.

Furthermore, as shown in FIG. 13, in the module with a built-in circuit component 2 of the present embodiment, the electric insulating layer 201 is divided into the first region D in which the plurality of circuit components 209 are placed, and the second region E in which the plurality of via conductors 203 are placed, in the same way as in Embodiment 1. Therefore, the density of the module is increased, and the difficulty in design for increasing the density is reduced. In the present embodiment, the circuit components 209 are not placed in the second region E, and the circuit components 209 are not placed between adjacent via conductors 203. Furthermore, in the first region D, the via conductors 209 are not placed.

In the example shown in FIG. 12, the wiring boards 208, 308 respectively have a multi-layered wiring structure in which one wiring layer is provided in the insulating substrates 28a, 38a to form a three-layered wiring structure. The number of the wiring layers is not limited. If the number of the wiring layers is increased, it becomes easy to handle a complicated circuit, route wiring, and the like.

Furthermore, even in the present embodiment, in the same way as in Embodiment 1, the plurality of via conductors 203 may not be necessarily arranged at an equal interval. Furthermore, each of a pair of the wiring layers 28b, 38b may include a non-connection land portion that is not connected to any of the plurality of via conductors 203, but is used for an inspection. A plurality of land portions including connection land portions connected to the via conductors 203 and non-connection land portions may be arranged substantially in a matrix shape.

Embodiment 4

In Embodiment 4, an exemplary method for producing the module with a built-in circuit component of Embodiment 3 will be described. The material used in Embodiment 4 is the same as that described in Embodiment 1. Furthermore, the same members as those in Embodiment 3 are denoted with the same reference numerals as those therein, and the description thereof will be omitted here.

First, a wiring board 208 (first sheet-shaped material) is produced as follows (see FIG. 15A). The wiring board 208 can be produced by a conventionally known method. For example, two sheet-shaped materials having a plurality of through holes are formed of a mixture containing a thermosetting resin and an inorganic filler, and each through hole is filled with a conductive resin composition. Then, the sheet-shaped materials filled with the conductive resin composition are stacked so that wiring layers are placed therebetween to form a stack. A wiring layer 28b is provided on one surface of the stack, and a wiring layer 28c is provided on the other surface thereof. The stack is heated, whereby the two sheet-shaped materials with the cured thermosetting resin thereof become an insulating substrate 28a, and the cured conductive resin composition becomes via conductors 28d. A wiring board 308 also is produced in the same way as in the wiring board 208.

Figure 15A:
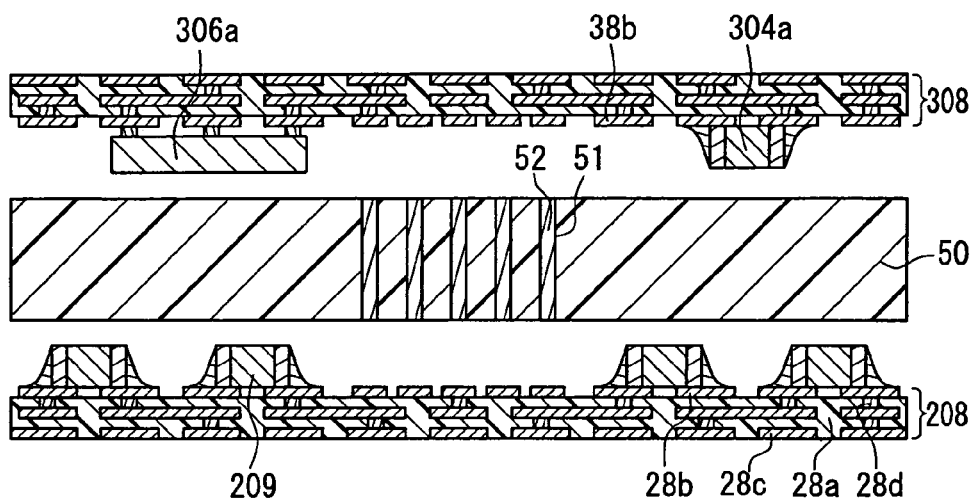
FIGS. 15A to 15C are cross-sectional views based on processes of an exemplary method for producing the module with a built-in circuit component shown in FIG. 12.
Figure 16:
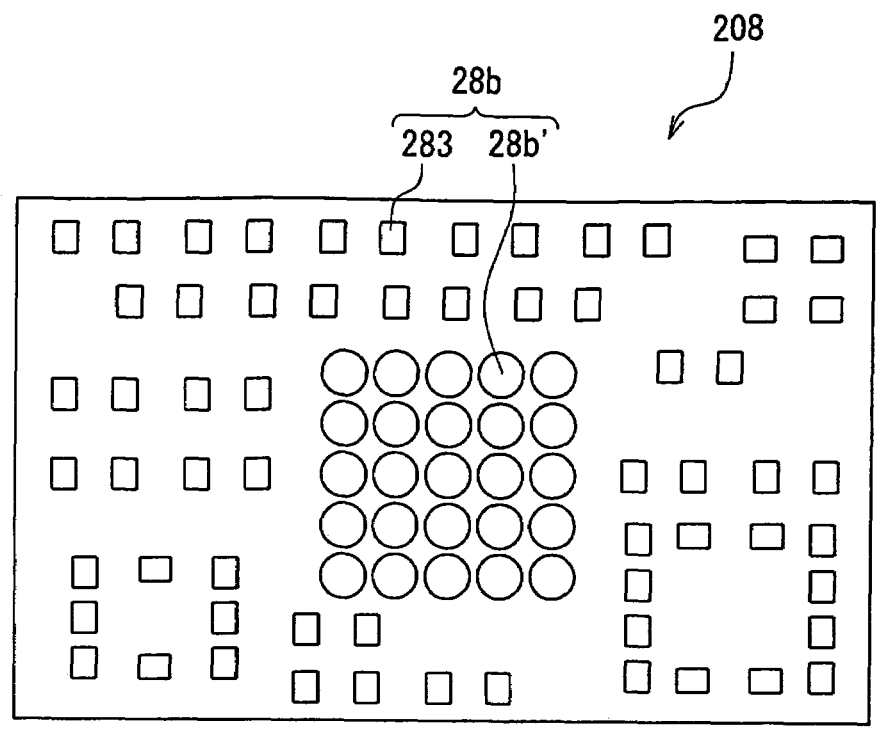
FIG. 16 is a schematic view of a wiring board shown in FIG. 15A.

FIG. 16 is a schematic view of the wiring board 208 (first sheet-shaped materials) seen from the side of the wiring layer 28b. The wiring layer 28b is composed of a plurality of land portions 28b', a plurality of pad electrodes 283 connected to electrodes of circuit components, conductive wires (not shown), other land portions (not shown), and the like. The plurality of land portions 28b' are formed at an interval so as to substantially form a matrix in a center portion of the insulating substrate 28a. For ease of understanding, the above-mentioned conductive wires, other land portions, and the like are omitted in FIG. 16. On a wiring layer 38b of the wiring board 308, land portions also are formed at positions corresponding to the land portions 28b' (See FIG. 15A).

Next, as shown in FIG. 15A, circuit components 209 are mounted on the wiring board 208, and circuit components 306a, 304a are mounted respectively on the wiring board 308.

In parallel with the above, a second sheet-shaped material 50 in which a plurality of through holes 51 are provided at predetermined portions is formed, and the through holes 51 are filled with a conductive resin composition 52. The through holes 51 are provided at positions corresponding to the land portions 28b' (See FIG. 16). The second sheet-shaped material 50 can be produced by the same material and method as those of the sheet-shaped material 30 (see FIG. 9A).

Next, for example, the circuit components 209 mounted on the wiring layer 208 and the circuit components 306a, 304a mounted on the wiring board 308 are subjected to a mounting inspection.

Figure 15B:
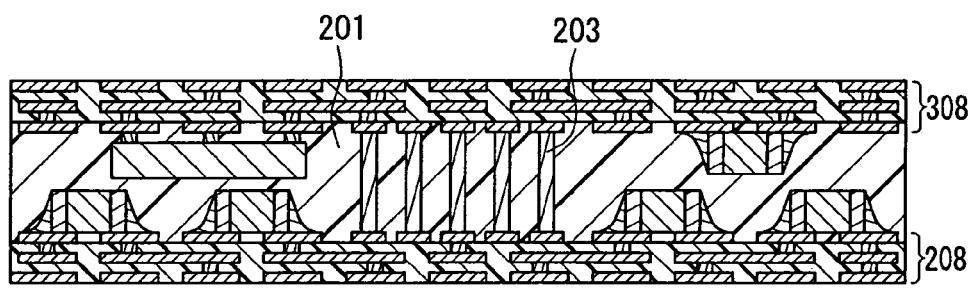

Next, as shown in FIG. 15A, the second sheet-shaped material 50 in which the through holes 51 are filled with the conductive resin composition 52 is placed between the wiring board 208 with circuit components 209 mounted thereon and the wiring board 308 with the circuit components 304a, and 306a mounted thereon. Then, these are heated under pressure in a thickness direction, whereby the circuit components 209, 304a, and 306a are buried in the second sheet-shaped material 50, and the second sheet-shaped material 50 and the thermosetting resin contained in the conductive resin composition 52 are cured. The conditions of heating and pressing are the same as those in Embodiment 2. The second sheet-shaped material 50 cured by heating functions as an electric insulating layer 201, and the conductive resin composition 52 functions as via conductors 203 (see FIG. 15B).

Figure 15C:
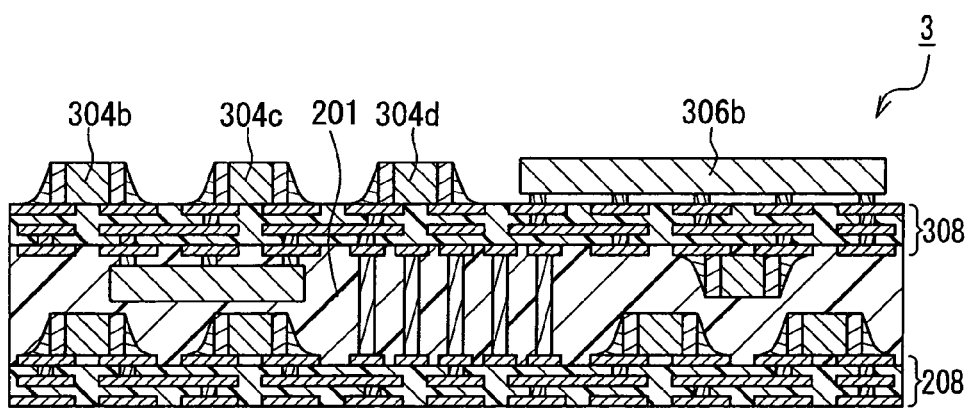

Next, as shown in FIG. 15C, by mounting circuit components 304b to 304d and 306b on the wiring board 308, a module with a built-in circuit component is obtained.

Next, an inspection process will be described. As shown in FIG. 14, the wiring board 208 with a plurality of circuit components (not shown) mounted thereon is placed on a supporting plate 7. Then, the supporting plate 7 is aligned with a support 5 of an inspection tool 6 so that tips of probes 4 of the inspection tool 6 come into contact with the land portions 28b'. By bringing the inspection tool 6 close to the supporting plate 7 under the condition that an end face of the support 5 of the inspection tool 6 is aligned with an end face of the supporting plate 7, the ends of the probes 4 can be aligned easily with the land portions 28b'. Then, by applying a voltage to the wiring board 208 with a plurality of circuit components mounted thereon, a plurality of circuit components are subjected to a mounting inspection. The circuit components 306a, 304a (see FIG. 15A) mounted on the wiring board 308 also are subjected to a mounting inspection similarly. In FIG. 14, the circuit components 209 (see FIG. 15A) mounted on the wiring board 208 are omitted. Furthermore, in FIG. 14, regarding the wiring layer 28b (see FIG. 15A), only the land portions to be connected to via conductors in an electric insulating layer are shown.

Figure 17:
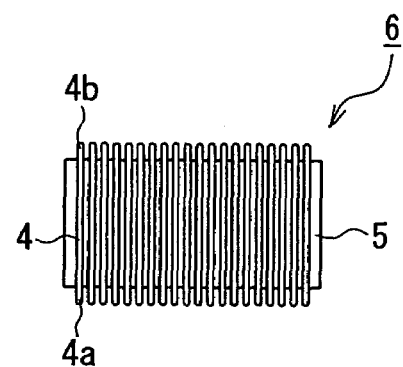
FIG. 17 is a cross-sectional view showing an example of an inspection tool used in an exemplary method for producing a module with a built-in circuit component of the present invention.

The above-mentioned mounting inspection also can be performed, for example, with the inspection tool 6 as shown in FIG. 17. The inspection tool 6 shown in FIG. 17 includes a support 5 having rubber elasticity and a plurality of probes 4. The probes 4 pass through the support 5, and both ends 4a, 4b project from the support 5. In the inspection tool 6 shown in FIG. 17, the interval between the adjacent probes 4 is narrow, so that the alignment with respect to an object to be inspected is easy. FIG. 17 is a cross-sectional view of the inspection tool 6. For convenience, hatching is omitted.

The surface of the wiring board 208 on which the circuit components 209 are mounted is opposed to the surface of the wiring board 308 on which the circuit components 304a, 306a are mounted, and the inspection tool 6 shown in FIG. 17 is placed between the wiring boards 208 and 308 (see FIG. 15A). Tips of the ends 4a, 4b of the probes 4 are brought into contact with the land portions constituting the respective wiring layers 28b, 38b. Then, a voltage is applied to a mounted body in which the circuit components 209 are mounted on the wiring board 208, and to a mounted body in which the circuit components 304a, 306a are mounted on the wiring board 308, whereby the circuit components 209, 304a, and 306a are subjected to a mounting inspection.

Figure 18:
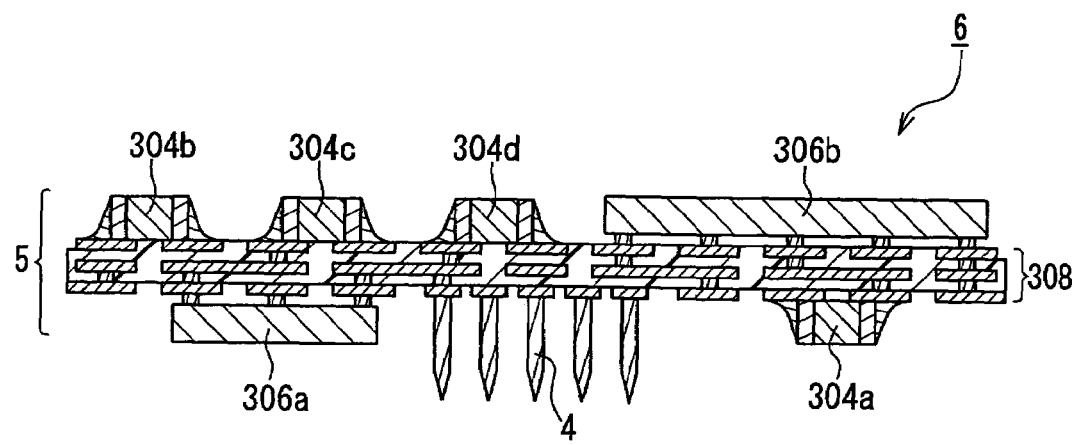
FIG. 18 is a cross-sectional view showing another example of an inspection tool used in an exemplary method for producing a module with a built-in circuit component of the present invention.

Furthermore, a characteristics inspection also can be performed with an inspection tool as shown in FIG. 18. As shown in FIG. 18, the inspection tool 6 includes a structure 5 in which the circuit components 304a to 304d, 306a, and 306b are mounted on the wiring board 308, and a plurality of probes 4 are electrically connected to the structure 5. The inspection tool 6 is brought into contact with the land portions 28b' (see FIG. 14), and a voltage is applied thereto under this condition, whereby the electrical operation of a provisional module is checked. By checking the electrical operation of the provisional module, the characteristics of the mounted body in which the circuit components are mounted on the wiring substrate 208 can be inspected.

More specifically, as shown in FIGS. 12 and 13, a method for producing a module with a built-in circuit component, including a first circuit system that includes a first wiring layer 28b and a first circuit component 209 electrically connected to the first wiring layer 28b, a second circuit system that includes a second wiring layer 38b and second circuit components 304a to 304d, 306a, and 306d electrically connected to the second wiring layer 38b, an electric insulating layer 201 placed between the first circuit system and the second circuit system, in which at least the first circuit component is buried, and a plurality of via conductors 203 placed in the electric insulating layer 201 and electrically connecting the first and second circuit systems, includes a first process of forming the first wiring layer 28b including a plurality of land portions 28b' on one principal plane of an insulating substrate 28a, and thereafter, mounting the first circuit component 209 on the insulating substrate 28a on which the first wiring layer is formed, and a second process of inspecting the characteristics of the first circuit system. In the first process, the plurality of land portions 28b' are formed in a center portion of one principal plane of the insulating substrate 28a in accordance with a predetermined rule. In the second process, the above inspection is performed using an inspection tool including the structure 5 having the same configuration as that of the second circuit system and a plurality of probes 4 placed so as to correspond to the land portions 28b' electrically connected to the structure 5. In the second process, the electrical operation of the provisional module electrically connecting the first circuit system and the inspection tool is checked, whereby the characteristics of the first circuit system are inspected.

The above-mentioned method for producing a module with a built-in circuit component also is applicable to a method for producing a module with a built-in circuit component in which a plurality of via conductors are placed on a circumference of an electric insulating layer in accordance with a predetermined rule.

Embodiment 5

Figure 19:
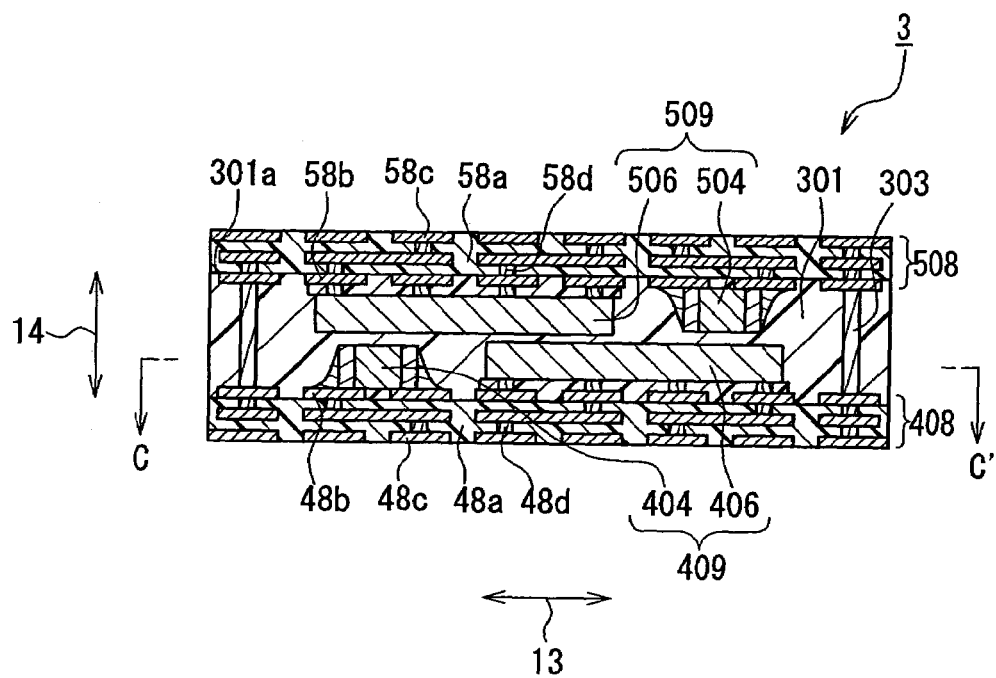
FIG. 19 is a cross-sectional view showing still another exemplary module with a built-in circuit component of the present invention.
Figure 20:
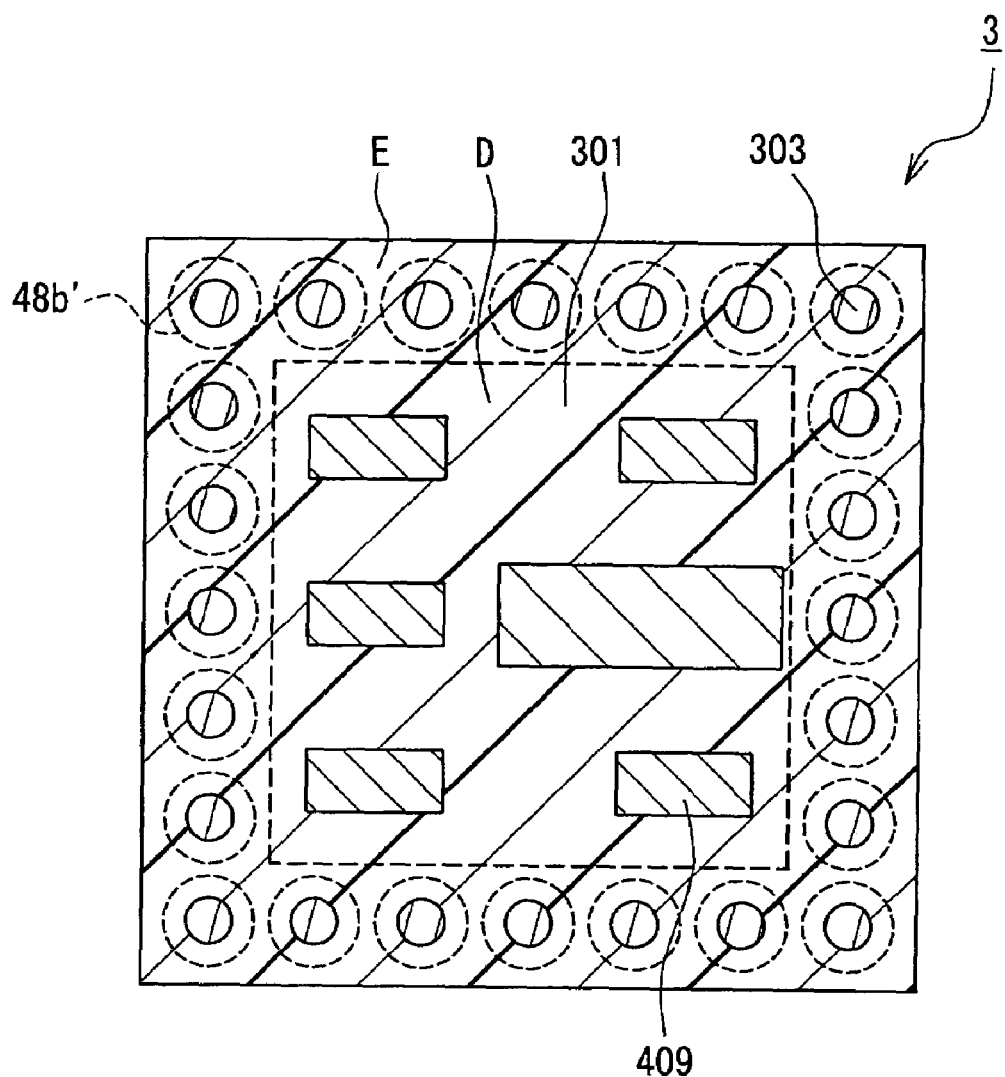
FIG. 20 is a cross-sectional view of the module with a built-in circuit component shown in FIG. 19 taken along a line C-C'.

FIG. 19 is a cross-sectional view of a module with a built-in circuit component of the present embodiment. FIG. 20 is a cross-sectional view of the module with a built-in circuit component shown in FIG. 12, taken along a line C-C'.

As shown in FIGS. 19 and 20, a module with a built-in circuit component 3 of the present embodiment includes an electric insulating layer 301 in a rectangular shape in a plan view, a pair of wiring layers 48b, 58b provided on both principal planes of the electric insulating layer 301, a plurality of via conductors 303 electrically connecting the wiring layers 48b, 58b, and a plurality of circuit components 409 (404, 406) and 509 (506, 504) buried in the electric insulating layer 301. The via conductors 303 pass through the electric insulating layer 301 in a thickness direction thereof. In the module with a built-in circuit component 3, the pair of the wiring layers 48b, 58b are embedded in the electric insulating layer 101.

As shown in FIG. 20, the plurality of via conductors 303 are placed on a circumference of the electric insulating layer 301, and arranged at an interval so as to form a rectangle along four sides of the electric insulating layer 301, in a cut surface of the electric insulating layer 301 cut in a direction parallel to a principal plane 301a (see FIG. 19). The plurality of via conductors 303 are arranged substantially at an equal interval.

The wiring layer 48b shown in FIG. 19 includes a plurality of land portions 48b' as shown in FIG. 20, and any of the land portions 48b' are connected to the via conductors 303.

In FIG. 20, regarding the wiring layer 48b (see FIG. 19), only the plurality of land portions 48b' arranged on a circumference of the electric insulating layer 301 are shown. Conductive wires, pad electrodes connected to electrodes of circuit components, and other land portions constituting the wiring layer 48b are omitted. The other land portions refer to those that are connected to via conductors 48d (see FIG. 19) constituting a wiring board 408. Furthermore, the wiring layer 58b (see FIG. 19) also has a plurality of land portions at positions corresponding to the land portions 48b'.

As shown in FIG. 19, the module with a built-in circuit component 3 includes a pair of wiring boards 408, 508 placed so as to sandwich the electric insulating layer 301. The wiring layers 48b, 58b embedded in the principal plane of the electric insulating layer 301 function as the wiring layers for the wiring boards 408, 508. The circuit components 409, 509 are mounted on the wiring boards 408, 508 to be integrated therewith before being buried in the electric insulating layer 301. In FIG. 19, reference numerals 48a, 58a denote insulating substrates, 48d, 58d denote via conductors, and 48c, 58c denote wiring layers, which constitute the wiring boards 408, 508, respectively.

The module with a built-in circuit component 3 also can share an inspection tool used in at least one inspection selected from a mounting inspection and a characteristic inspection with various kinds of modules with a built-in circuit component, in the same way as in Embodiments 1 and 3. Therefore, the reduction in cost and enhancement of productivity can be realized.

As shown in FIG. 20, even in the module with a built-in circuit component 3, in the same way as in Embodiments 1 and 3, the electric insulating layer 301 is divided into a first region D in which the plurality of circuit components 409 are placed and a second region E in which the plurality of via conductors 303 are placed, in a cut surface of the electric insulating layer 301 cut in a direction parallel to the principal plane 301a (see FIG. 19). Therefore, the density of the module can be increased, and the difficulty in design for increasing the density is reduced. In the present embodiment, the via conductors 303 are not placed in the first region D, and the via conductors 303 are not placed between adjacent circuit components 409. In the second region E, the circuit components 409 are not placed. The first region D is present at the center of the electric insulating layer 301, and the second region E is placed on the circumference of the electric insulating layer 301 to surround the first region D.

As shown in FIG. 19, for example, when the Young's modulus and coefficient of linear thermal expansion of the electric insulating layer 301 containing no reinforcing material and the like are compared with those of the wiring boards 408, 508 containing a reinforcing material such as glass fabrics and aramid non-woven fabric, the Young's modulus of the wiring boards 408, 508 is larger than that of the electric insulating layer 301. More specifically, the ratio between the stress applied to a cross-section and the extension per unit length is larger in the wiring boards 408, 508 than in the electric insulating layer 301. The coefficient of linear thermal expansion in a direction 13 orthogonal to the thickness direction of the electric insulating layer 301 is larger than that of the wiring boards 408, 508. As shown in FIG. 19, in the module with a built-in circuit component 3 including the pair of wiring boards 408, 508 placed so as to sandwich the electric insulating layer 301, the expansion of the electric insulating layer 301 in the direction 13 is suppressed by the wiring substrates 408, 508 having a relatively large Young's modulus. Therefore, in the electric insulating layer 301, the expansion degree in the thickness direction (z-axis direction) 14 is increased. The connection between the via conductors 303 and the land portions is weak relative to the force in the thickness direction 14. Therefore, when the expansion degree of the electric insulating layer 301 in the thickness direction (z-axis direction) 14 is increased, the reliability of the electric connection by the via conductors 303 is degraded. This phenomenon is observed more remarkably in a center portion than in a circumferential portion of the electric insulating layer 301. The reason for this is that the side surfaces of the module-with a built-in circuit component are opened. In the module with a built-in circuit component 3 of the present embodiment, the plurality of via conductors 303 are placed on a circumference of the electric insulating layer 301. Therefore, the reliability of electric connection between the wiring layers by the via conductors 303 after reflowing or the like is high.

Figure 21:
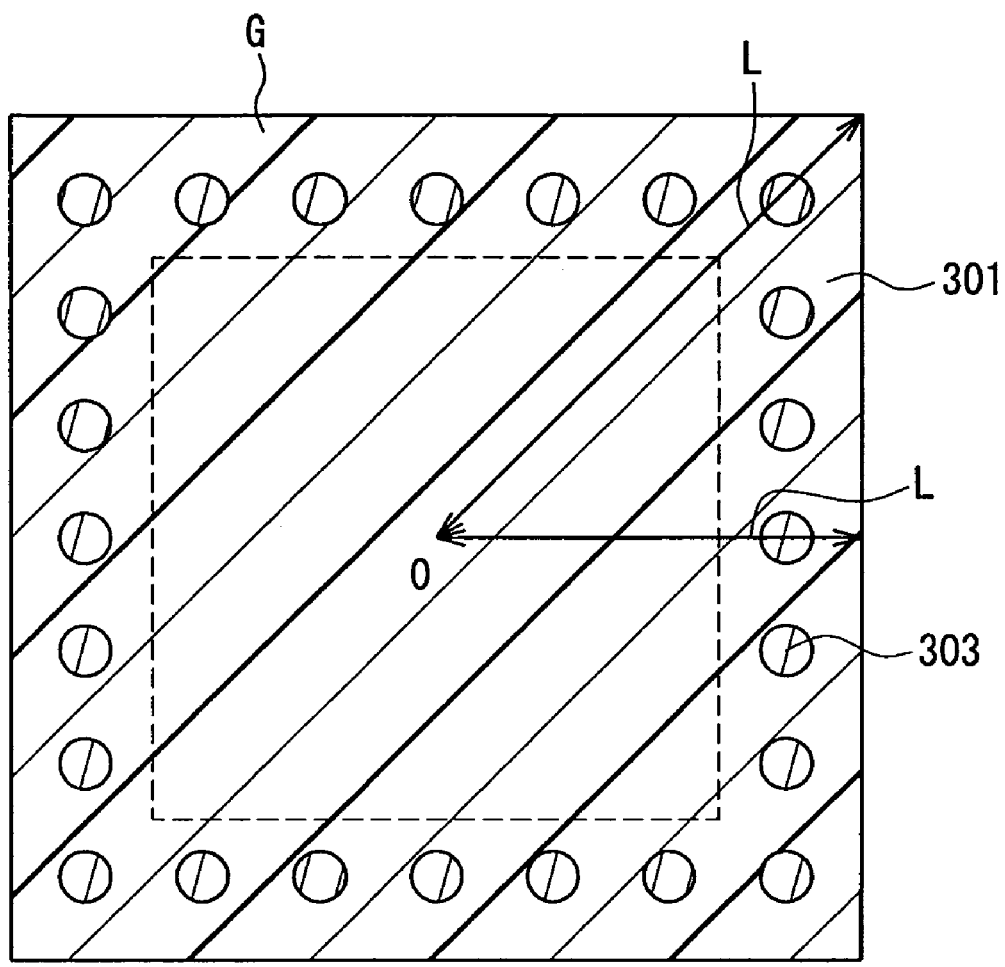
FIG. 21 is a cross-sectional view showing a cut surface of an electric insulating layer constituting the module with a built-in circuit component shown in FIG. 19, cut in a direction parallel to a principal plane of the electric insulating layer.

As shown in FIG. 21, it is assumed that the distance from a center O on a surface cut in a direction parallel to the principal plane of the electric insulating layer 301 to an edge of the surface is L. In the module with a built-in circuit component of the present embodiment, in the region G positioned at a distance exceeding 0.7 L from the center O, the plurality of via conductors 303 are placed. Therefore, as shown by the results of the example (described later), the reliability of electric connection by the via conductors 303 is high. In FIG. 21, circuit components buried in the electric insulating layer 301 are omitted.

Embodiment 6

In Embodiment 6, an exemplary method for producing the module with a built-in circuit component 3 of Embodiment 5 will be described with reference to FIGS. 22A-22C to 24A-24B. In FIGS. 22A-22C and 23, the same members as those in Embodiment 5 are denoted with the same reference numeral as those therein, and the description thereof will be omitted here.

Figure 22A:
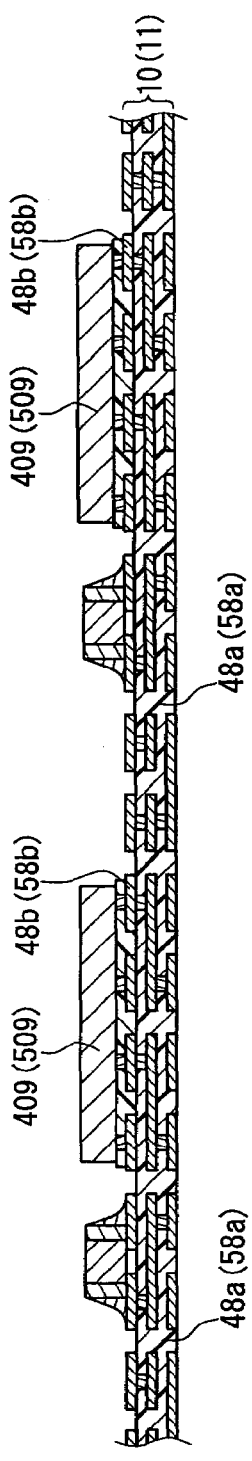
FIGS. 22A to 22C are cross-sectional views based on processes showing an exemplary method for producing the module with a built-in circuit component shown in FIG. 19.

First, as shown in FIG. 22A, a pair of third sheet-shaped materials 10, 11, in which a plurality of wiring layers 48b, 58b are formed on insulating bases including a plurality of insulating substrates 48a, 58a, are produced. A method for producing the third sheet-shaped materials 10, 11 is the same as the method for producing the wiring boards 208, 308 described with reference to FIG. 15A. However, in the present embodiment, the plurality of insulating substrates 48a, 58a are integrated. The material used for producing the third sheet-shaped materials 10, 11 is the same as that for producing the wiring boards 208, 308 described with reference to FIG. 15A.

Figure 23:
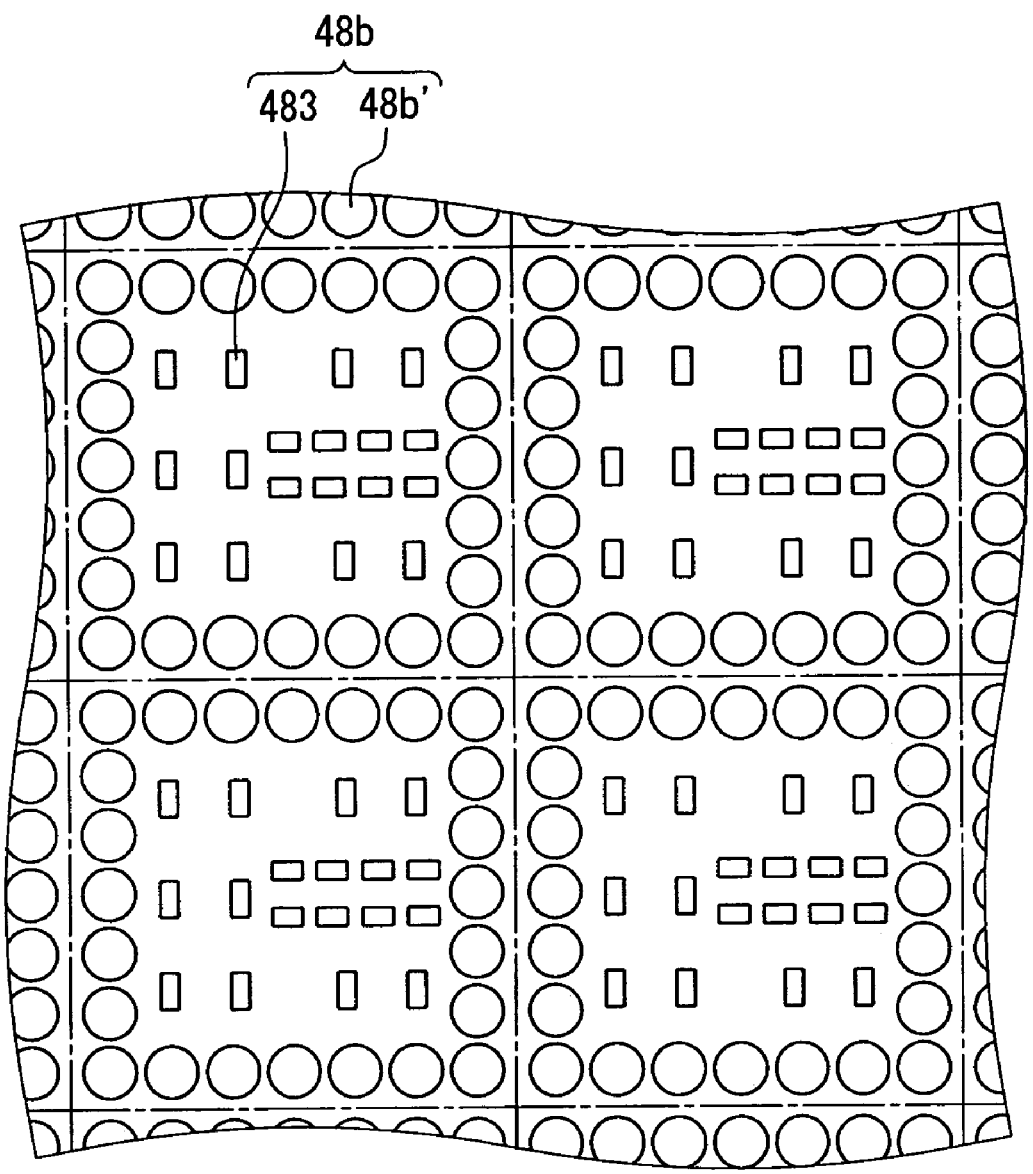
FIG. 23 is a partial plan view showing a third sheet-shaped material shown in FIG. 22A.

FIG. 23 is a partial plan view of the third sheet-shaped material 10 seen from the side of the wiring layers 48b. The wiring layers 48b are composed of a plurality of land portions 48b', pad electrodes 483 connected to electrodes of circuit components, conductive wires (not shown), other land portions (not shown), and the like. The plurality of land portions 48b' are formed at an interval so as to form a rectangle on a circumference of one principal plane of the insulating substrates 48a. In the wiring layers 58b of the third sheet-shaped material 11, a plurality of land portions are formed at positions corresponding to the land portions 48b'.

Next, as shown in FIG. 22A, plural sets of circuit components 409, 509 are mounted on the third sheet-shaped materials 10, 11. Then, the mounted plural sets of the circuit components 409, 509 are subjected to a mounting inspection.

Figure 24A:
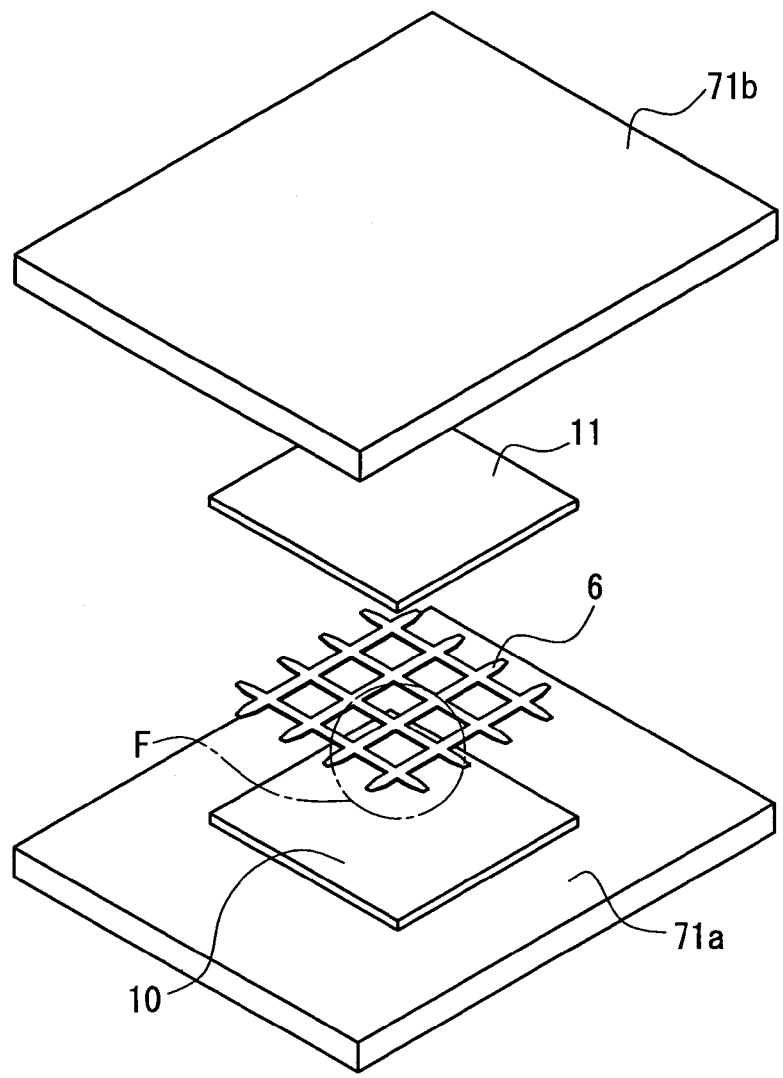
FIG. 24A is a perspective view illustrating the state of an inspection performed in the course of production of the module with a built-in circuit component shown in FIG. 19.
Figure 24B:
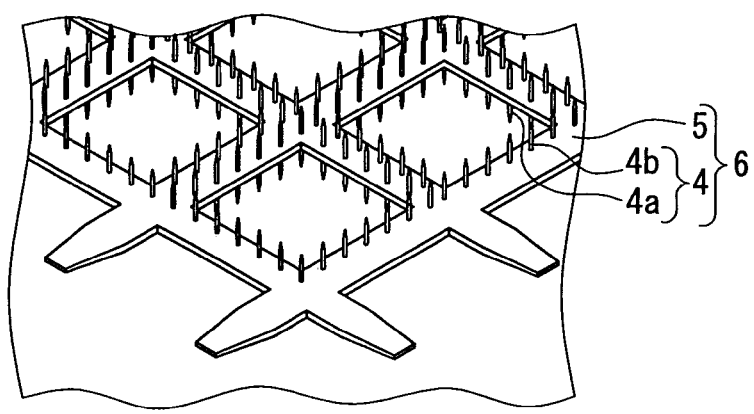
FIG. 24B is an enlarged view of a portion "F" shown in FIG. 24A.

FIGS. 24A and 24B show the state where a characteristic inspection is being performed. As shown in FIGS. 24A and 24B, an inspection tool 6 used for an inspection includes a support 5 having a plurality of openings and a plurality of probes 4 placed so as to surround each opening. Both ends 4a, 4b of the plurality of probes 4 pass through the support 5 to project therefrom. Tips of the ends 4a, 4b are tapered.

The third sheet-shaped materials 10, 11 with circuit components (not shown) mounted thereon are fixed to supporting plates 71a, 71b, and the third sheet-shaped materials 10, 11 are placed so that surfaces with circuit components mounted thereon are opposed to each other. The inspection tool 6 is placed between the third sheet-shaped materials 10, 11. Tips of the ends 4a of the probes 4 are brought into contact with the land portions (see FIG. 23) of the wiring layer 48b (see FIG. 22A), and tips of the ends 4b of the probes 4 are brought into contact with the land portions of the wiring layer 58b (see FIG. 22A), whereby a provisional module is formed. Then, the electrical operation of the provisional module is checked by applying a voltage to the third sheet-shaped materials 10, 11 with the circuit components mounted thereon, whereby the components of the module with a built-in circuit component 3 are subjected to a characteristics inspection. In FIG. 24A, for convenience, the circuit components and the wiring layers mounted on the third sheet-shaped materials 10, 11 are omitted.

The thickness of the inspection tool 6 is larger than the total thickness of the circuit components 409 and 509. Therefore, the circuit components 409, 509 are suppressed from being damaged by shock during an inspection (see FIGS. 22A and 24).

Figure 22B:
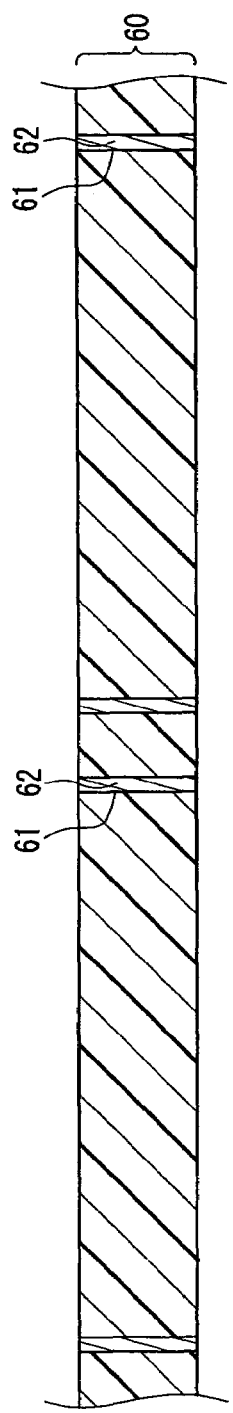
Figure 22C:
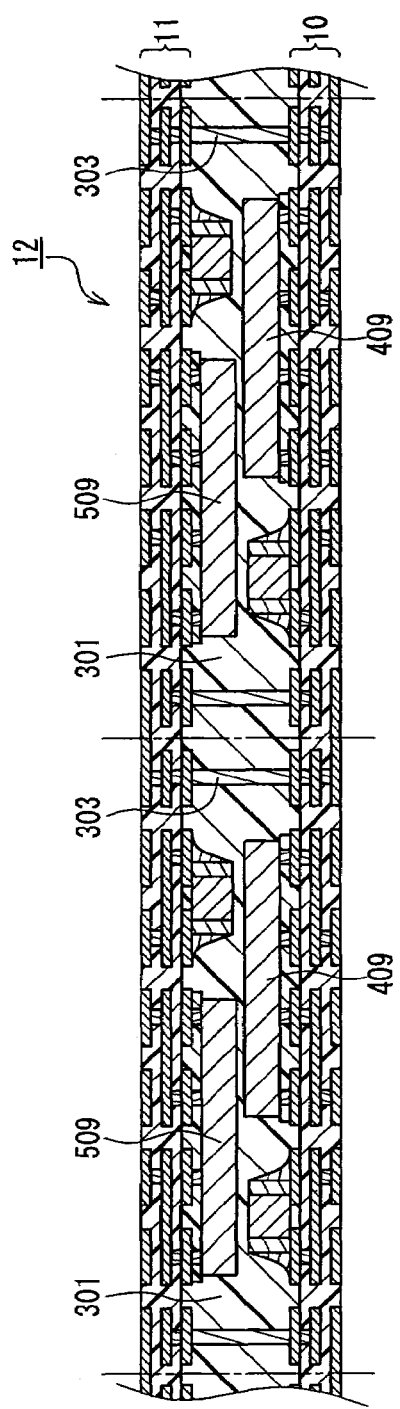

On the other hand, as shown in FIG. 22B, a fourth sheet-shaped material 60 in which a plurality of through holes 61 are provided at predetermined portions is formed. The through holes 61 are provided at positions corresponding to the land portions 48*b*' (see FIG. 23). Then, the through holes 61 are filled with a conductive resin composition 62. The fourth sheet-shaped material 60 is produced by the same method for producing the sheet-shaped material 30 (see FIG. 9A) and is made of the same material as that for the sheet-shaped material 30.

Then, the fourth sheet-shaped material 60 filled with the conductive resin composition 62 is placed between the third sheet-shaped materials 10, 11 with the plural sets of circuit components 409, 509 mounted thereon. Then, these are heated under pressure in a thickness direction. As a result, the circuit components 408, 509 are buried in the fourth sheet-shaped material 60, and the fourth sheet-shaped material 60 and the thermosetting resin contained in the conductive resin composition 62 are cured. Thus, a fifth sheet-shaped material 12, in which the circuit components 409, 509 are placed between the third sheet-shaped materials 10, 11, is formed. The conditions of heating and pressing are the same as those in Embodiment 2 (see FIG. 22C).

Next, the fifth sheet-shaped material 12 is cut at predetermined positions (represented by alternate long and short dash lines), whereby the plural sets of circuit components 409, 509 are separated on the basis of a set. The fifth sheet-shaped material 12 is cut with a dicer or the like. The fourth sheet-shaped material 60 that has been cured and cut functions as an electric insulating layer 301, and the conductive resin composition 62 functions as via conductors 303 (see FIG. 22C).

Thus, according to the method for producing a module with a built-in circuit components of the present embodiment, a module with a built-in circuit component can be produced efficiently.

The modules with a built-in circuit components of Embodiments 1 to 6 include wiring boards, and are subjected to an inspection with respect to the circuit components mounted on the wiring boards. The present invention is not limited thereto. The following also may be possible. The module with a built-in circuit component of the present invention does not include a wiring board; a plurality of circuit components are mounted on a peeling film on which a wiring layer is formed in the course of production; and after the circuit components are inspected, they are buried in an electric insulating layer.

EXAMPLE

Next, the relationship between the positions where via conductors are formed in an electric insulating layer and the stability of electric connection by via conductors was studied.

Fourteen modules each having a flat shape of 10 mm×10 mm, fourteen modules each having a flat shape of 30 mm×30 mm, and fourteen modules each having a flat shape of 50 mm×50 mm were produced. The thickness of each module was set to be 1.6 mm.

A material for an electric insulating layer was obtained by forming a mixture containing 20% by weight of epoxy resin, 80% by weight of $SiO_2$ (average particle size: 7 µm or less), and methyl ethyl ketone (MEK) (solvent) into a sheet (thickness: 1.0 mm; 5 parts by weight of MEK is contained in a fresh sheet, which has just been formed, with respect to 100 parts by weight of a mixture containing epoxy resin and $SiO_2$). A glass epoxy substrate (FR4) (MCL-E-67, produced by Hitachi Chemical Co., Ltd.) was used for a wiring board.

In an uncured (B stage) electric insulating layer, a plurality of through holes (diameter: 150 µm) were formed with a puncher. The through holes were formed with 0.5 mm pitches from the center O (see FIG. 21) of the electric insulating layer. Then, the through holes were filled with a conductive paste. As the conductive paste, a mixture containing 85% by weight of copper powder coated with silver (average particle size: 5 µm) and 15% by weight of epoxy resin was used.

The electric insulating layer filled with the conductive paste was placed between two wiring boards, and the wiring boards and the electric insulating layer were aligned to be stacked. Under this condition, the stack was heated at 180° C. for one hour under a pressure of 3 MPa. As a result of the heating, the electric insulating layer and the conductive paste were cured to obtain a module.

The Young's modulus of the electric insulating layer constituting the module thus obtained was about 3 GPa. On the other hand, the wiring boards had a configuration in which glass fabrics were impregnated with epoxy resin. Therefore, it is easily understood that the Young's modulus of the wiring boards was larger than that of the electric insulating layer. The Young's modulus of the electric insulating layer was measured in accordance with JIS K 7162.

Furthermore, since the wiring boards had a configuration in which glass fabrics were impregnated with epoxy resin, it is easily understood that the coefficient of linear thermal expansion of the wiring boards in a direction orthogonal to the thickness direction thereof was smaller than that of the electric insulating layer.

Figure 25:
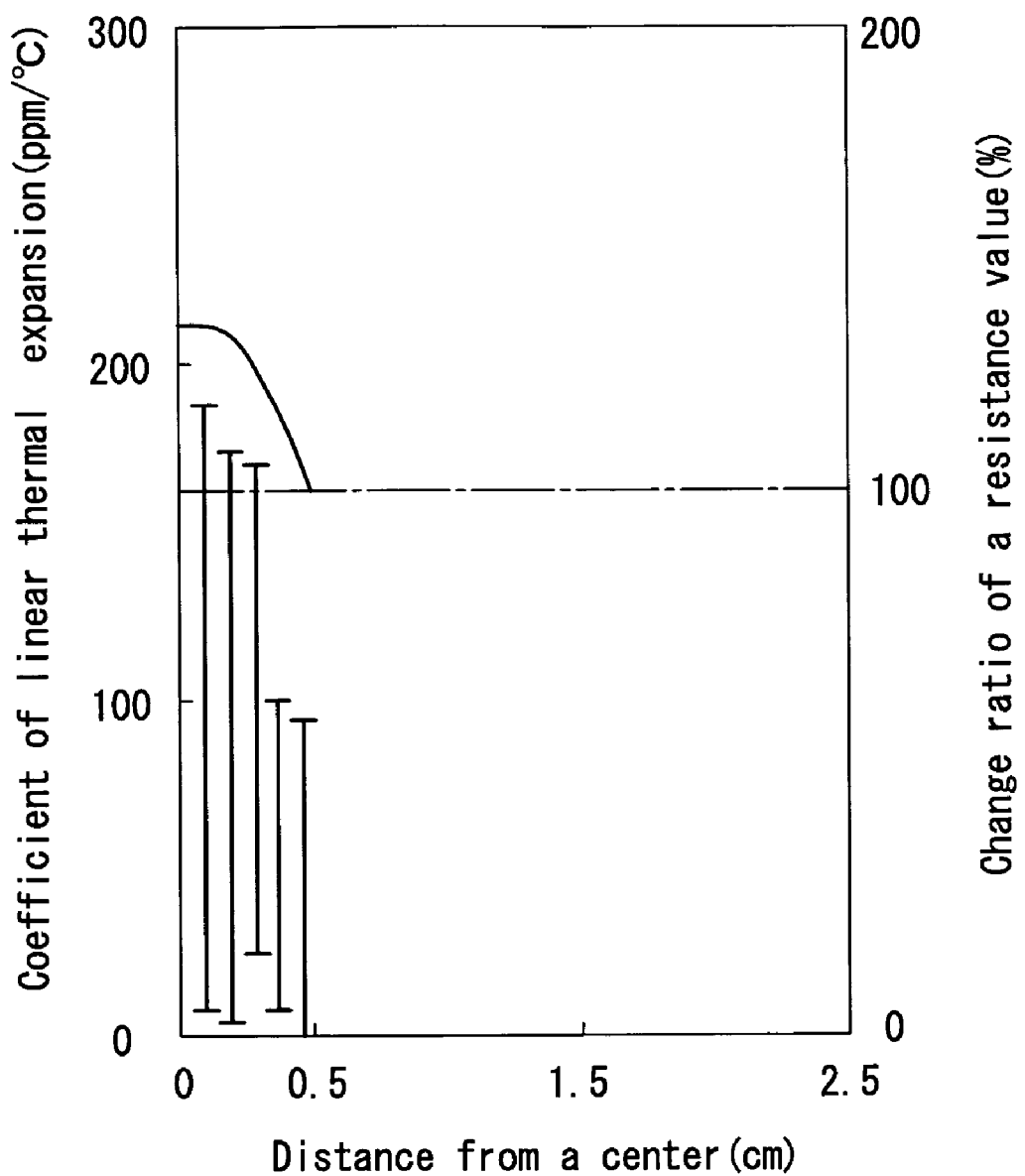
FIGS. 25 to 27 are graphs each showing a relationship between a distance of a via conductor from the center of an electric insulating layer, and a coefficient of linear thermal expansion and a change ratio of a resistance of the via conductor.
Figure 26:
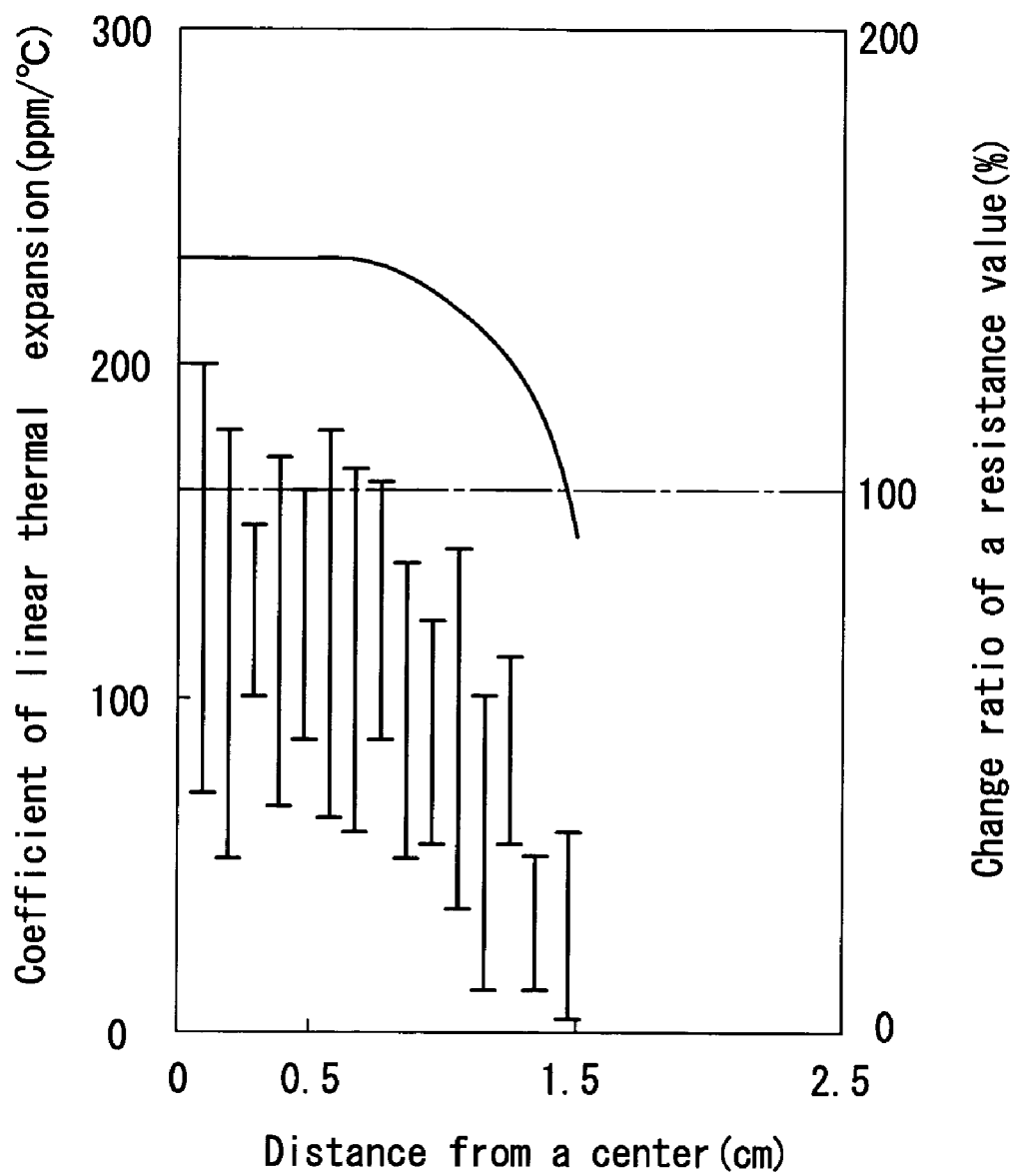
Figure 27:
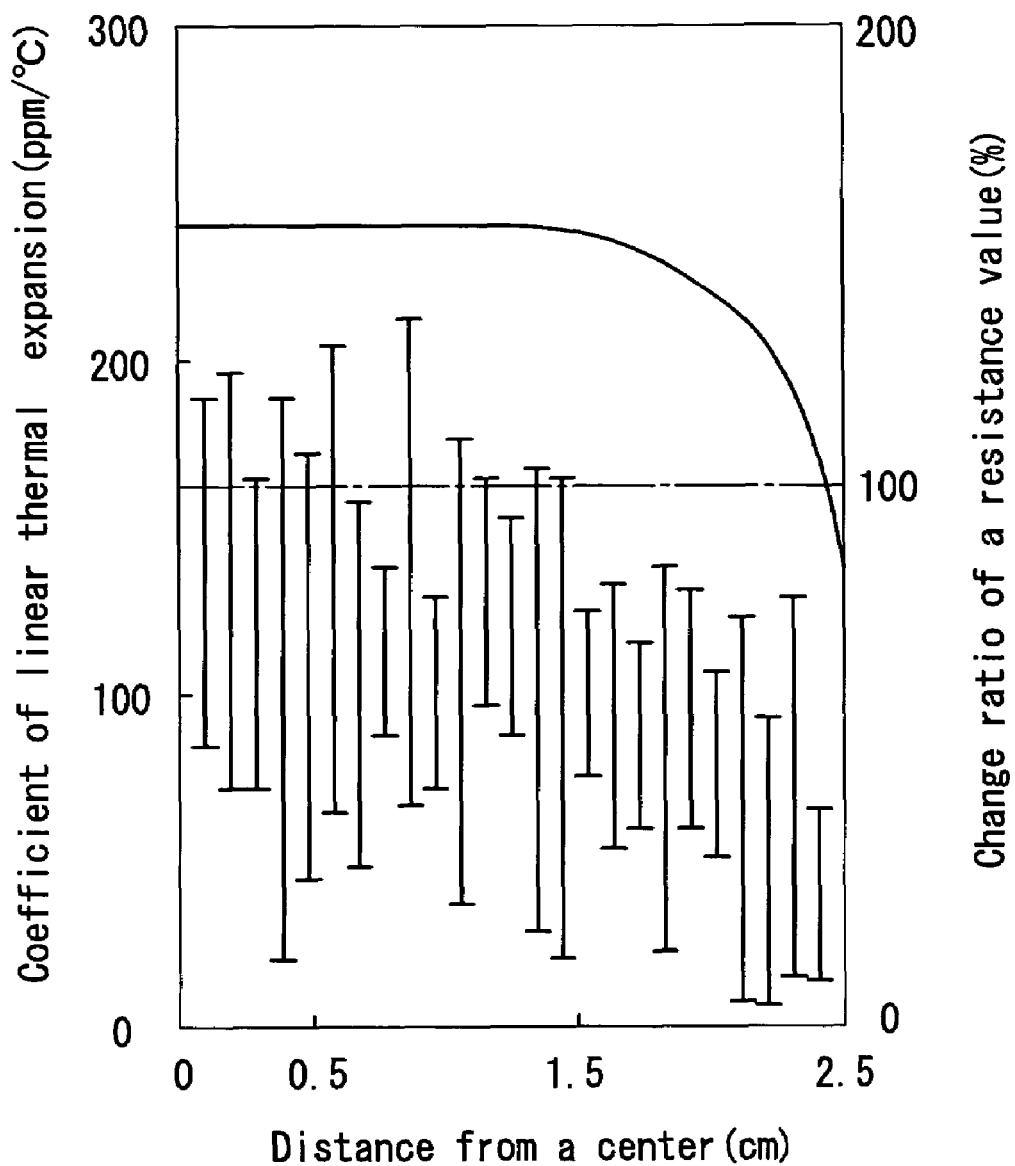

Three kinds of modules thus obtained were subjected to a heat resistance test in accordance with the following method. The resistance value of the via conductors before and after the heat resistance test was measured. The resistance value was measured in accordance with a four-terminal method. Furthermore, one module was selected from 14 modules, and measured for the coefficient of linear thermal expansion in a direction orthogonal to the thickness direction thereof by the following method. FIGS. 25 to 27 show the results. FIG. 25 shows the results of the 10 mm×10 mm modules. FIG. 26 shows the results of the 30 mm×30 mm modules. FIG. 27 shows the results of the 50 mm×50 mm modules.

[Heat Resistance Test]

One cycle of operation, in which each module was allowed to stand in an atmosphere of 260° C. for 10 seconds or longer using a belt-type reflow test machine, and allowed to stand until the surface temperature of the module reached 25° C. (room temperature), was performed 10 times.

[Coefficient of Linear Thermal Expansion]

The coefficient of linear thermal expansion of each module in a thickness direction was measured using a laser displacement meter (CHR 150N, produced by FRT GmbH). In order to enhance the measurement sensitivity, copper foils were provided at measurement portions. The amount of change in thickness was measured at intervals of 10° C. while an atmospheric temperature was being raised from 25° C. to 260° C. A graph was drawn with a temperature being taken on a horizontal axis, and the change amount being taken on a vertical axis, and the coefficient of linear thermal expansion was obtained from the gradient of the graph at 260° C.

In FIGS. 25 to 27, the change ratio (%) of a resistance value is based on the resistance value of via conductors before performing the heat resistance test. For example, if the resistance value after performing the heat resistance test is twice that before performing the heat resistance test, the change ratio is 100%. If the change ratio is 100% or less, the reliability of electric connection is determined to be satisfactory.

As shown in FIG. 25, in a region at a distance exceeding 0.35 cm from the center O (see FIG. 21) of the electric insulating layer, the change ratio of the resistance value of the via conductors was 100% or less. More specifically, assuming that a distance from the center O on a surface cut in a direction parallel to the principal plane of the electric insulating layer 301 to an edge of the surface is L, in a region at a distance exceeding 0.7 L from the center O, the change ratio of the resistance value of the via conductors was 100% or less.

Similarly, in FIGS. 26 and 27, in a region at a distance exceeding 0.7 L from the center O (corresponding to a region at a distance exceeding 1.05 cm from the center O in FIG. 26, or a region at a distance exceeding 1.75 cm from the center O in FIG. 27), the change ratio of the resistance value of the via conductors was 100% or less.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A module with a built-in circuit component, comprising:
    an electric insulating layer;
    a pair of wiring layers provided on both principal planes of the electric insulating layer;
    a plurality of via conductors electrically connecting the pair of wiring layers and passing through the electric insulating layer in a thickness direction thereof;
    a circuit component buried in the electric insulating layer; and
    a pair of wiring boards disposed so as to sandwich the electric insulating layer,
    wherein one of the pair of wiring layers provided on both principal planes of the electric insulating layer functions as a wiring layer for one of the wiring boards, and the other wiring layer functions as a wiring layer for the other wiring board,
    the plurality of via conductors are disposed at least on a part of a circumference of the electric insulating layer in accordance with a predetermined rule,
    a coefficient of linear thermal expansion of the wiring boards in a direction orthogonal to a thickness direction thereof is smaller than that of the electric insulating layer in a direction orthogonal to a thickness direction thereof, and
    a Young's modulus of the wiring boards is larger than that of the electric insulating layer.

2. The module with a built-in circuit component according to claim 1, wherein a flat shape of the electric insulating layer is a rectangle, and the plurality of via conductors are disposed at an interval along three sides among four sides of the rectangle, viewed in a cut surface of the electric insulating layer cut in a direction parallel to the principal plane thereof.

3. The module with a built-in circuit component according to claim 1, wherein a flat shape of the electric insulating layer is a rectangle, and the plurality of via conductors are disposed at an interval so as to form a rectangle along four sides of the rectangle, viewed in a cut surface of the electric insulating layer cut in a direction parallel to the principal plane thereof.

4. The module with a built-in circuit component according to claim 1, wherein the plurality of via conductors are arranged in a zigzag manner, viewed in a cut surface of the electric insulating layer cut in a direction parallel to the principal plane thereof.

5. The module with a built-in circuit component according to claim 1, wherein the wiring board has a multi-layered wiring configuration in which at least one wiring layer is provided in an insulating substrate.

6. The module with a built-in circuit component according to claim 1, wherein
    assuming that a distance from a center on a surface of the electric insulating layer viewed in a cut surface cut in a direction parallel to the principal plane thereof to an edge of the surface is L, the plurality of via conductors are disposed in a region at a distance exceeding 0.7 L from the center.

* * * * *